United States Patent
Tomiyasu et al.

(10) Patent No.: US 8,673,413 B2
(45) Date of Patent: Mar. 18, 2014

(54) METHOD FOR PACKING SOLID ORGANOMETALLIC COMPOUND AND PACKED CONTAINER

(75) Inventors: Shizuo Tomiyasu, Shunan (JP); Kohichi Tokudome, Shunan (JP); Kenichi Haga, Shunan (JP)

(73) Assignee: Tosoh Finechem Corporation, Shunan-shi (JP)

( * ) Notice: Subject to any disclaimer, the term of this patent is extended or adjusted under 35 U.S.C. 154(b) by 2361 days.

(21) Appl. No.: 11/340,739

(22) Filed: Jan. 27, 2006

(65) Prior Publication Data
US 2007/0175397 A1    Aug. 2, 2007

(51) Int. Cl.
*B29D 22/00* (2006.01)
*C23C 16/00* (2006.01)

(52) U.S. Cl.
USPC .......................... 428/34.1; 118/726

(58) Field of Classification Search
USPC .......................... 428/34.1; 118/726
See application file for complete search history.

(56) References Cited

U.S. PATENT DOCUMENTS

2006/0121198 A1 * 6/2006 Shenai-Khatkhate et al. .................. 427/255.28

FOREIGN PATENT DOCUMENTS

| JP | 2003160865 A | * | 6/2003 |
| JP | 2003303772 A | * | 10/2003 |

OTHER PUBLICATIONS

Machine Translation of JP 2003160865A; 2003.*
Machine Translation of JP 2003303772A; 2003.*

* cited by examiner

*Primary Examiner* — James Yager
(74) *Attorney, Agent, or Firm* — Wenderoth, Lind & Ponack, L.L.P.

(57) ABSTRACT

A method for packing a solid organometallic compound into a container for packing the compound is provided, wherein the solid organometallic compound can be stably supplied to a vapor phase epitaxial growth apparatus such as an MOCVD apparatus at a constant concentration for a long period of time. In the method for packing a solid organometallic compound into a container for packing, the compound is composed of grains having a grain size of 8 mm or less and the grains of the compound essentially comprise grains having a grain size of 2.5 to 6 mm.

12 Claims, 36 Drawing Sheets

(A)

(C)

(B)

(A)

(B)

(A)

(B)

(A)

(B)

(A)

(B)

(A)

(B)

(A)

(B)

(A)

(B)

(A)

(B)

(A)

(C)

(B)

(A)

(C)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(C)

METHOD FOR PACKING SOLID ORGANOMETALLIC COMPOUND AND PACKED CONTAINER

BACKGROUND OF THE INVENTION

1. Field of the Invention

The present invention relates to a method for packing a solid organometallic compound into a container for packing and also relates to a solid organometallic compound-packed container packed by means of the packing method. More particularly, the invention relates to a method for packing a solid organometallic compound into a container for packing, wherein the solid organometallic compound can be stably supplied to a vapor phase epitaxial growth apparatus at a constant concentration for a long period of time. A solid organometallic compound serves as a material for vapor phase epitaxial growth by means of, for example, a Metalorganic Chemical Vapor Deposition (hereinafter, abbreviated as "MOCVD") method which is employed when a material for electronics industry such as a compound semiconductor is manufactured. Also, the invention relates to a solid organometallic compound-packed container packed by means of the packing method.

2. Description of the Related Art

An organometallic compound such as trimethylindium has widely been used as a raw material for manufacturing a material for electronics industry.

Recently, vapor phase epitaxial growth by means of the MOCVD method or a similar method has often been used as a manufacturing method of a material for electronics industry by use of an organometallic compound. For example, a thin film of a compound semiconductor has been manufactured by means of the MOCVD method. In this case, an organometallic compound such as trimethylaluminum, trimethylgallium, or trimethylindium has been employed as a raw material.

In the MOCVD method in which such an organometallic compound is employed, if the organometallic compound is solid under the use conditions thereof, the organometallic compound is normally supplied to an MOCVD apparatus by means of the following method. That is, the organometallic compound is packed into a container for packing (hereinafter referred to as a packing container A) including a carrier gas inlet ($2a$) and a carrier gas outlet ($3a$) shown in FIG. 33. A carrier gas such as hydrogen gas is introduced into the container from the carrier gas inlet ($2a$), and then the carrier gas saturated with the organometallic compound is drawn from the carrier gas outlet ($3a$) and supplied to the MOCVD apparatus.

In this case, if the organometallic compound is solid at an operating temperature of the above supplying method, a certain flow path may be formed in which the carrier gas passes through the packing container A without sufficiently contacting with the solid organometallic compound. For this and other reasons, it is difficult to maintain a uniform contact state between the carrier gas and the solid organometallic compound. Thus, a problem arises that the solid organometallic compound is not stably supplied by the carrier gas from the packing container A to the MOCVD apparatus at a constant concentration for a long period of time. In addition, in the abovementioned method for supplying the solid organometallic compound by use of the carrier gas, as the amount of the compound packed into the packing container A increases, the ratio of the amount of the compound which can be stably supplied to the MOCVD apparatus to the above packed amount decreases. Therefore, a problem arises that the solid organometallic compound cannot be efficiently used since the unused amount of the compound increases in the packed container.

In order to solve the above problems, various methods have been proposed for packing a solid organometallic compound into the packing container A. For example, a method has been proposed in which a solid organometallic compound is packed into a packing container together with a packing material (see, for example, Patent Documents 1 to 5 listed below). Also, for example, a method has been proposed in which an inert carrier is coated with a solid organometallic compound and is packed into the packing container A (see, for example, Patent Document 6).

In addition, in a method for solving the above problems, various structures of a packing container itself have been proposed for packing a solid organometallic compound. For example, a structure of a packing container has been proposed which has a diffuser ($20a$) provided in a carrier gas inlet for uniformly distributing gas, as shown in FIG. 34 (see, for example, Patent Document 7). In this container (hereinafter referred to as a packing container B), a carrier gas is allowed to uniformly flow through a solid organometallic compound.

Also, a packing container (hereinafter referred to as a packing container C) has been proposed which has a solid organometallic compound chamber ($21a$) having air permeability, as shown in FIG. 35 (see, for example, Patent Document 8).

Moreover, a packing container (hereinafter referred to as a packing container D) has been proposed in which a porous inlet chamber serves as a packing portion for a solid organometallic compound, as shown in FIG. 36 (see, for example, Patent Document 9).

In addition, a method has been proposed for controlling grain size to stably supply a solid organometallic compound in the case where a ruthenium compound is employed (see, for example, Patent Document 10).

[Patent Document 1] Japanese Patent Publication No. Hei 5-39915
[Patent Document 2] Japanese Patent Publication No. Hei 6-20051
[Patent Document 3] Japanese Patent Laid-Open Publication No. Hei 7-58023
[Patent Document 4] Japanese Patent Laid-Open Publication No. Hei 8-250440
[Patent Document 5] Japanese Patent Laid-Open Publication No. Hei 8-299778
[Patent Document 6] Publication of Japanese Patent No. 2651530
[Patent Document 7] Japanese Patent Publication No. Hei 2-124796
[Patent Document 8] Japanese Patent Laid-Open Publication No. Hei 10-223540
[Patent Document 9] Japanese Patent Laid-Open Publication No. 2002-83777
[Patent Document 10] Japanese Patent Laid-Open Publication No. 2003-160865

However, in the packing methods and the packing containers proposed in Patent Documents 1 to 9, studies have not been made for the grain size of a solid organometallic compound itself to be packed into the packing container.

Also, in Patent Document 10 or the like, the effect of controlling the grain size of the ruthenium compound on the supply stability is described only for an initial supply state. This consideration has been made by producing films only several times, and it is not clear that the effect is maintained to stably supply the ruthenium compound at a constant concentration for a long period of time. The present inventors have conducted studies and found that a grain size-controlling method exists for obtaining not only initial stability but also long-term stability upon supplying a solid organometallic compound by use of a carrier gas.

SUMMARY OF THE INVENTION

The present invention solves the abovementioned problems. It is an object of the invention to provide a method for packing a solid organometallic compound into a container for packing the compound, wherein the compound can be stably supplied to a vapor phase epitaxial growth apparatus such as an MOCVD apparatus at a constant concentration for a long period of time. It is another object of the invention to provide a packed container in which a solid organometallic compound is packed by means of the packing method.

In order to solve the abovementioned problems, the present inventors have conducted studies for supplying a solid organometallic compound at a constant concentration for a long period of time by packing the compound into a packing container and allowing a carrier gas to flow therethrough. Consequently, the inventors have found that, by adjusting the grain size of a solid organometallic compound to a certain size or less upon packing the compound into a container for packing a solid organometallic compound, not only the initial supply stability can be ensured, but also this supply stability can be maintained for a long period of time. Thus, the present invention has been completed.

Specifically, the present invention relates to a method for packing a solid organometallic compound into a container for packing the compound. The packing method is characterized in that, upon packing the solid organometallic compound into the container for packing the compound, the grain size of the solid organometallic compound is 8 mm or less and in that grains of the solid organometallic compound essentially comprise ones having a grain size of 2.5 to 6 mm.

Further, in the packing method of the present invention, the solid organometallic compound having the grain size adjusted as described above may be packed together with a packing material.

Specifically, the present invention relates to a method for packing a solid organometallic compound into a container for packing the compound. The packing method is characterized in that the solid organometallic compound is composed of grains having a grain size of 8 mm or less and in that grains of the solid organometallic compound essentially comprise ones having a grain size of 2.5 to 6 mm and the solid organometallic compound described above is packed together with a packing material.

Moreover, in the present method for packing a solid organometallic compound into a container for packing the compound, the solid organometallic compound is packed together with a packing material, and the packing material having a size of 0.8 to 8 mm is employed.

Further, in the present method for packing a solid organometallic compound into a container for packing the compound, this container for packing the compound has a carrier gas inlet and a carrier gas outlet. The container for packing is characterized by having a structure in which the inside of the container is partitioned into a plurality of vertical spaces. In the above structure, a carrier gas introduced from the carrier gas inlet flows through each of the vertical spaces and is discharged from the carrier gas outlet.

Moreover, in the present method for packing a solid organometallic compound into a container for packing the compound, the container for packing a solid organometallic compound may satisfy the following requirements (a) to (c):

(a) The container has a structure in which the inside of the container is partitioned by at least one partition in the vertical direction to form at least two partitioned spaces in the container.

(b) The spaces formed by partitioning the inside of the container by the partition include a space having the carrier gas inlet and a space having the carrier gas outlet.

(c) The partition inside the container includes a partition having an opening which allows the carrier gas to flow from the carrier gas inlet via each of the spaces inside the container to the carrier gas outlet.

In the present method for packing a solid organometallic compound into a container for packing the compound, the container satisfying the requirements (a) to (c) is characterized in that, when the opening is placed in the lower portion of the partition, the opening is placed in a position located at one-third or less of the internal height of the container measured from the internal bottom thereof. Further, this container is characterized in that, when the opening is placed in the upper portion of the partition, the opening is placed in a position located at two-third or more of the internal height of the container measured from the internal bottom thereof.

Further, in the present method for packing a solid organometallic compound into a container for packing the compound, the container satisfying the requirements (a) to (c) is characterized by having a packing opening for packing the compound into the spaces formed inside the container by partitioning the container by the partition.

Moreover, in the present method for packing a solid organometallic compound into a container for packing the compound, the container having the carrier gas inlet and the carrier gas outlet is characterized by having a structure in which the inside of the container is partitioned into a plurality of vertical spaces. In the above structure, a carrier gas introduced from the carrier gas inlet flows through each of the vertical spaces as a downward flow formed by means of carrier gas flow direction inverting means and is discharged from the carrier gas outlet.

Further, in the present method for packing a solid organometallic compound into a container for packing the compound, the container may satisfy the following requirements (d) to (h):

(d) The container has a structure in which the inside of the container is partitioned by at least one partition in the vertical direction to form at least two partitioned spaces in the container.

(e) The spaces formed by partitioning the inside of the container by the partition include a space having the carrier gas inlet and a space having the carrier gas outlet.

(f) The partition inside the container includes a partition having a communication flow passage which has a lower opening and an upper opening each for allowing a carrier gas to flow from the carrier gas inlet via each of the spaces inside the container to the carrier gas outlet.

(g) The communication flow passage has a structure in which the carrier gas introduced inside the container is introduced from the lower opening of the communication flow passage and is discharged from the upper opening of the passage.

(h) The container has a discharging flow passage having a lower opening for discharging the carrier gas from the lower portion of the space having the carrier gas outlet to the carrier gas outlet.

Moreover, in the present method for packing a solid organometallic compound into a container for packing the compound, the container satisfying the requirements (d) to (h) is characterized in that the lower opening of the communication flow passage is placed in a position located at one-third or less of the internal height of the container measured from the internal bottom thereof. Also, this container is characterized in that the upper opening of the communication flow passage is placed in a position located at two-third or more of the internal height of the container measured from the internal bottom thereof. In addition, this container is characterized in that the lower opening of the discharging flow passage is placed in a position located at one-third or less of the internal height of the container measured from the internal bottom thereof.

Further, in the present method for packing a solid organometallic compound into a container for packing the compound, the container satisfying the requirements (d) to (h) is characterized by having a packing opening for packing the compound into the spaces formed inside the container by partitioning the container by the partition.

In the present method for packing a solid organometallic compound into a container for packing the compound, trimethylindium may be employed as the solid organometallic compound.

In addition, the present invention relates to a solid organometallic compound-packed container in which a solid organometallic compound is packed by means of the abovementioned packing method of the present invention.

In the present invention, the solid organometallic compound essentially contains grains having a certain grain size upon packing the compound into the container for packing the compound. Therefore, not only the initial supply stability can be ensured, but also the compound can be stably supplied to a vapor phase epitaxial growth apparatus such as an MOCVD apparatus for a long period of time.

BRIEF DESCRIPTION OF THE DRAWINGS

FIG. 1A, FIG. 1B, and FIG. 1C are schematic views showing one embodiment of a container for packing according to the present invention, in which FIG. 1A is a cross-sectional view thereof, FIG. 1B is a plan view thereof, and FIG. 1C is a perspective view thereof;

FIG. 2A and FIG. 2B are schematic views showing another embodiment of a container for packing according to the present invention, in which FIG. 2A is a cross-sectional view thereof, and FIG. 2B is a plan view thereof;

FIG. 3A and FIG. 3B are schematic views showing still another embodiment of a container for packing according to the present invention, in which FIG. 3A is a cross-sectional view thereof, and FIG. 3B is a plan view thereof;

FIG. 4A and FIG. 4B are schematic views showing still another embodiment of a container for packing according to the present invention, in which FIG. 4A is a cross-sectional view thereof, and FIG. 4B is a plan view thereof;

FIG. 5A and FIG. 5B are schematic views showing still another embodiment of a container for packing according to the present invention, in which FIG. 5A is a perspective view thereof, and FIG. 5B is a cross-sectional view thereof;

FIG. 6A and FIG. 6B are schematic views showing still another embodiment of a container for packing according to the present invention, in which FIG. 6A is a perspective view thereof, and FIG. 6B is a cross-sectional view thereof;

FIG. 7A, FIG. 7B, and FIG. 7C are schematic views showing another embodiment of a container for packing according to the present invention, in which FIG. 7A is a cross-sectional view thereof, FIG. 7B is a plan view thereof, and FIG. 7C is a perspective view thereof;

FIG. 8A, FIG. 8B, and FIG. 8C are schematic views showing another embodiment of a container for packing according to the present invention, in which FIG. 8A is a cross-sectional view thereof, FIG. 8B is a plan view thereof, and FIG. 8C is a perspective view thereof;

FIG. 9A and FIG. 9B are schematic views showing another embodiment of a container for packing according to the present invention, in which FIG. 9A is a perspective view thereof, and FIG. 9B is a cross-sectional view thereof;

FIG. 10A and FIG. 10B are schematic views showing another embodiment of a container for packing according to the present invention, in which FIG. 10A is a perspective view thereof, and FIG. 10B is a cross-sectional view thereof;

FIG. 11A and FIG. 11B are schematic views showing another embodiment of a container for packing according to the present invention, in which FIG. 11A is a perspective view thereof, and FIG. 11B is a cross-sectional view thereof;

FIG. 12A, FIG. 12B, and FIG. 12C are schematic views showing another embodiment of a container for packing according to the present invention, in which FIG. 12A is a cross-sectional view thereof, FIG. 12B is a plan view thereof, and FIG. 12C is a perspective view thereof;

FIG. 13A, FIG. 13B, and FIG. 13C are schematic views showing another embodiment of a container for packing according to the present invention, in which FIG. 13A is a cross-sectional view thereof, FIG. 13B is a plan view thereof, and FIG. 13C is a perspective view thereof;

FIG. 14A and FIG. 14B are schematic views showing another embodiment of a container for packing according to the present invention, in which FIG. 14A is a cross-sectional view thereof, and FIG. 14B is a plan view thereof;

FIG. 15A and FIG. 15B are schematic views showing another embodiment of a container for packing according to the present invention, in which FIG. 15A is a cross-sectional view thereof, and FIG. 15B is a plan view thereof;

FIG. 16A and FIG. 16B are schematic views showing another embodiment of a container for packing according to the present invention, in which FIG. 16A is a cross-sectional view thereof, and FIG. 16B is a plan view thereof;

FIG. 21A and FIG. 21B are schematic views showing another embodiment of a container for packing according to the present invention, in which FIG. 21A is a perspective view thereof, and FIG. 21B is a cross-sectional view thereof;

FIG. 22A and FIG. 22B are schematic views showing another embodiment of a container for packing according to the present invention, in which FIG. 22A is a perspective view thereof, and FIG. 22B is a cross-sectional view thereof;

FIG. 23A and FIG. 23B are schematic views showing another embodiment of a container for packing according to the present invention, in which FIG. 23A is a perspective view thereof, and FIG. 23B is a cross-sectional view thereof;

FIG. 24A and FIG. 24B are schematic views showing another embodiment of a container for packing according to the present invention, in which FIG. 24A is a perspective view thereof, and FIG. 24B is a cross-sectional view thereof;

FIG. 25A and FIG. 25B are schematic views showing another embodiment of a container for packing according to the present invention, in which FIG. 25A is a perspective view thereof, and FIG. 25B is a cross-sectional view thereof;

FIG. 26A and FIG. 26B are schematic views showing another embodiment of a container for packing according to the present invention, in which FIG. 26A is a perspective view thereof, and FIG. 26B is a cross-sectional view thereof;

FIG. 27A and FIG. 27B are schematic views showing another embodiment of a container for packing according to the present invention, in which FIG. 27A is a perspective view thereof, and FIG. 27B is a cross-sectional view thereof;

FIG. 28A, FIG. 28B, and FIG. 28C are schematic views showing another embodiment of a container for packing according to the present invention, in which FIG. 28A is a cross-sectional view thereof, FIG. 28B is a plan view thereof, and FIG. 28C is a perspective view thereof;

DETAILED DESCRIPTION OF THE PREFERRED EMBODIMENTS

Figure 1:
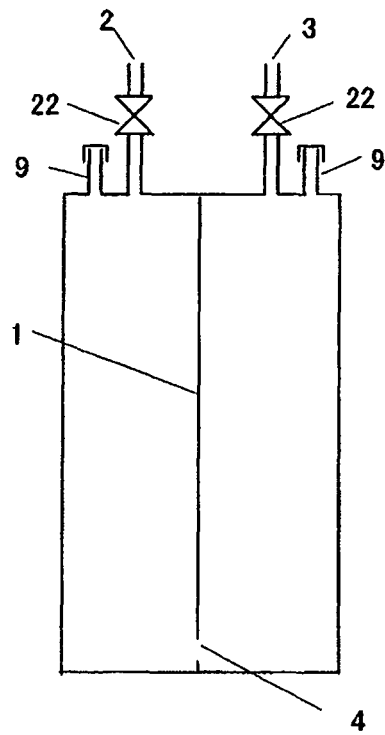
Figure 1:
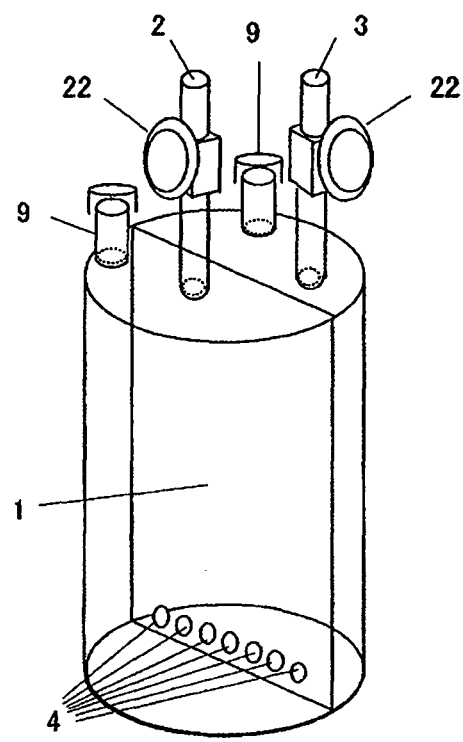
Figure 1:
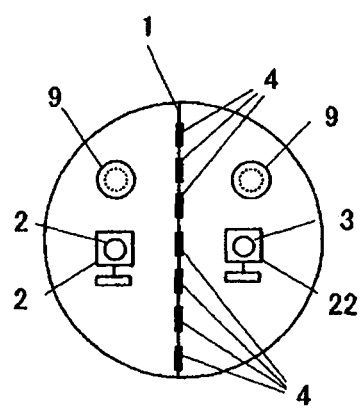

The packing method of the present invention will next be described in more detail. Also, the packed container in which a solid organometallic compound is packed by means of the packing method will be described in more detail.

The packing method of the present invention is characterized in that, upon packing a solid organometallic compound into a container for packing the compound, the grain size of the compound is 8 mm or less and in that grains of the solid organometallic compound essentially comprise ones having a grain size of 2.5 to 6 mm.

In the present invention, if, for example, the solid organometallic compound is packed as solid into the container for packing, the compound which may be employed has a grain size which allows the compound to pass through an opening of a packing inlet provided in the container. The grain size is normally 8 mm or less, preferably 6 mm or less, and more preferably 5 mm or less. In addition, the grains of the solid organometallic compound essentially comprise ones having a grain size of 2.5 to 6 mm.

If the grain size of the solid organometallic compound exceeds 8 mm, the area of contact between a carrier gas and the compound decreases upon increasing the flow rate of the carrier gas, and thus the time of contact is not sufficient for saturation. Thus, the supply stability cannot be obtained for a long period of time.

The ratio of the amount of the grains having a grain size of 2.5 to 6 mm to the total amount of the solid organometallic compound is, for example, 30 to 100%, preferably 40 to 100%, and more preferably 50 to 100%.

This is because, if the ratio of the amount of the grains having a grain size of 2.5 to 6 mm to the total amount of the solid organometallic compound is small, the supply stability may not be obtained for a long period of time. In this case, for example, if the amount of grains having a grain size larger than 6 mm is large, the carrier gas does not sufficiently contact with the solid organometallic compound as the flow rate of the carrier gas increases as described above, thereby deteriorating the long-term supply stability. Alternatively, for example, if the amount of grains having a grain size less than 2.5 mm is large, the area of contact between the carrier gas and the grains increases. Thus, excellent supply stability is obtained in an initial state. However, while the solid organometallic compound is used for a long period of time, the compound is supplied to the carrier gas as a saturated vapor and is gradually consumed to thereby cause the grains to be smaller. Thus, the carrier gas tends not to flow through the space between the small grains but tends to flow through the space between larger grains. In this phenomenon, flow paths are likely to be formed through which the carrier gas flows without sufficiently contacting with the solid organometallic compound. Thus, the supply stability may not be obtained for a long period of time.

No particular limitation is imposed on the method for forming the grains of the solid organometallic compound, and a conventionally known method may be employed without any change. Examples of the forming method include a method in which a lump of a solid organometallic compound is pulverized and a method in which a solid organometallic compound is liquefied and then solidified.

No particular limitation is imposed on the method for controlling the grain size of the solid organometallic compound, and a conventionally known method for adjusting the grain size may be employed without any change. Examples of the method for controlling the grain size in which a lump of a solid organometallic compound is pulverized include a method in which a solid organometallic compound is pulverized and then sieved through a sieve having a certain mesh size to collect the compound. Also, examples of the method for controlling the grain size in which a solid organometallic compound is liquefied and then solidified include a method in which the weight of a droplet is controlled and a method in which a frame is used to control the shape of the liquid by the dimensions of the frame.

In the abovementioned method, no particular limitation is imposed on the method for obtaining the solid organometallic compound which has a grain size of 8 mm or less and grains of which essentially comprise the grains having a grain size of 2.5 to 6 mm. Specifically, for example, the following method may be employed. That is, a solid organometallic compound properly pulverized is sieved through a sieve having a mesh size of 8 mm to divide the compound into two groups (i.e., the grains passing through the sieve and the grains not passing through the sieve). Further, the sieved compound grains having a grain size of less than 8 mm are properly pulverized. Subsequently, grains are collected which pass through a sieve having a mesh size of 6 mm and do not pass a sieve having a mesh size of 2.5 mm, thereby obtaining the solid organometallic compound grains having a grain size of 2.5 to 6 mm. The obtained grains are mixed with grains having a grain size of 8 mm or less which are obtained by sieving through a sieve having a mesh size of 8 mm, thereby obtaining the solid organometallic compound essentially containing the grains having the grain size of 2.5 to 6 mm. Also, the following method may be employed. That is, a solid organometallic compound is simply pulverized so as to properly contain the grains having a grain size of 2.5 to 6 mm. Subsequently, the pulverized grains are sieved through a sieve having a mesh size of 2.5 to 6 mm, and all the grains passing through the sieve are collected.

In the above method, the solid organometallic compound is packed into the container for packing, and the carrier gas is allowed to flow therethrough. In this case, if the grain size of the solid organometallic compound is 8 mm or less, and if the grains of the compound essentially comprise the grains having a grain size of 2.5 to 6 mm, the compound can be supplied at a constant concentration for a long period of time. The reason for this effect may be that, since the grains of the compound essentially comprise the grains having a grain size of 2.5 to 6 mm, the carrier gas is facilitated to flow through the space formed between the grains having the abovementioned size. If the solid organometallic compound does not contain the grains having a grain size of 2.5 to 6 mm, the carrier gas sufficiently contacts with the compound in the space formed between the grains of the compound at an initial state of supplying the compound. However, while the compound is used for a long period of time, flow paths are likely to be formed through which the carrier gas flows without sufficiently contacting with the compound.

Therefore, if the grains of the solid organometallic compound do not comprise the grains having a grain size of 2.5 to 6 mm upon supplying the compound by use of the carrier gas, problems do not arise in the initial supply stability, but do arise in the long term stability. In the present invention, the grains of the solid organometallic compound employed essentially comprise the grains thereof having a grain size of 2.5 to 6 mm, and thus certain flow paths are not likely to be formed. Therefore, not only the supply amount is stabilized in a short term, but also the carrier gas can stably flow through the packed layers of the solid organometallic compound for a long period of time. Thus, it is conceivable that the supply stability of the solid organometallic compound is improved.

In the packing method of the present invention, no particular limitation is imposed on the structure of the usable container for packing the solid organometallic compound. For example, the conventionally known containers mentioned above may be employed without any change.

Further, in the packing method of the present invention, a container for packing having a structure other than that of the abovementioned container for packing the solid organometallic compound may be employed. The employable container for packing the solid organometallic compound has a carrier gas inlet and a carrier gas outlet and is characterized in that the inside of the container is partitioned into a plurality of vertical spaces. In this structure, a carrier gas introduced from the carrier gas inlet flows through each of the vertical spaces and is discharged from the carrier gas outlet.

Each of FIGS. 1 to 4 shows an example of the packing container for the solid organometallic compound. As shown in FIGS. 1 to 4, the container for packing the solid organometallic compound employed in the packing method of the present invention has a structure in which the inside of the container is partitioned by at least one partition (1) in the vertical direction to form at least two partitioned spaces. The space may be partitioned by the partition (1) to form the partitioned spaces as in the manner, for example, shown in FIGS. 1 to 4.

In addition to the container for packing having a cylindrical shape shown in FIGS. 1 to 4, the container for packing may have the exterior shape such as a triangular prism shape, a rectangular prism shape, a pentagonal prism shape, or a hexagonal prism shape.

Further, the container for packing the solid organometallic compound employed in the packing method of the present invention has a structure having a carrier gas inlet (2) and a carrier gas outlet (3). The carrier gas inlet (2) communicates with one of the spaces formed by partitioning the inside of the container by the partition (1), and the carrier gas outlet (3) communicates with one of the rest of the spaces. Examples of the structure of the container for packing include the structures shown in FIGS. 1 to 4. The carrier gas is introduced from the carrier gas inlet (2) into the container packed with the solid organometallic compound and is allowed to flow through the inside of the container. The carrier gas is then drawn from the carrier gas outlet (3) as a gas saturated with the organometallic compound and is supplied to an MOCVD apparatus. The placement positions of the carrier gas inlet (2) and the carrier gas outlet (3) in the container may be determined depending on the manner of partitioning the space by the partition (1), the usage of the container, and the like. For example, the carrier gas inlet (2) and the carrier gas outlet (3) may be placed in the top portion of the container or in the side surface of the container.

The container for packing employed in the present invention is characterized in that the partition (1) placed thereinside includes a partition (1) having an opening (4) for allowing the carrier gas to flow from the carrier gas inlet (2) to the carrier gas outlet (3) via each of the spaces inside the container, as shown in FIGS. 1 to 4.

Figure 5:
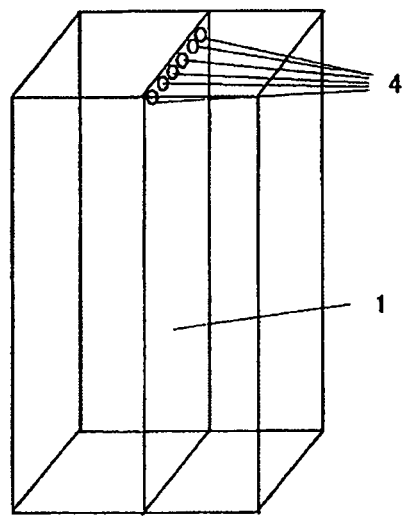
Figure 5:
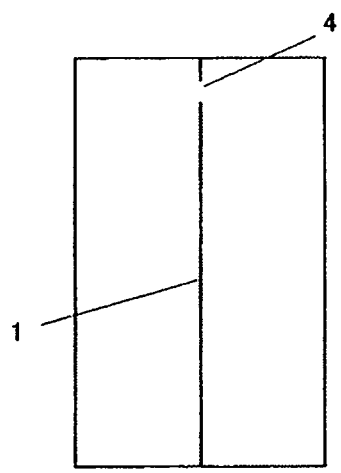
Figure 6:
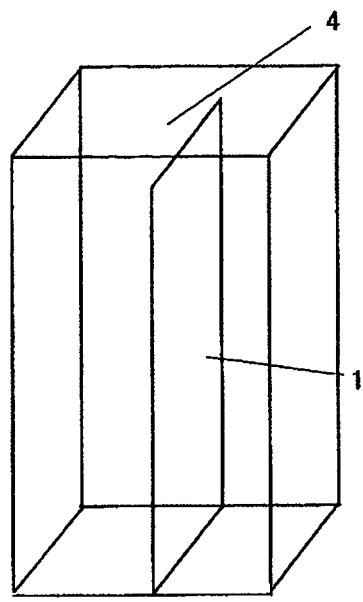
Figure 6:
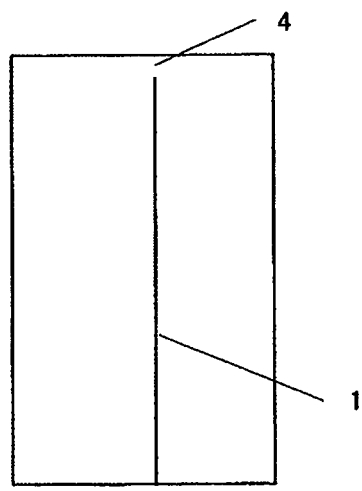

Examples of the partition (1) having the opening (4) include the structures shown in FIGS. 5 and 6.

No particular limitation is imposed on the position of the opening (4), so long as the carrier gas can sufficiently flow from the carrier gas inlet (2) to the carrier gas outlet (3) via the spaces packed with the solid organometallic compound. In this case, the carrier gas must be brought into sufficient contact with the packed solid organometallic compound, and the compound must be stably supplied without causing problems. Particularly, in order to bring the carrier gas into contact with the packed solid organometallic compound for effectively achieving saturation, the opening (4) for allowing the carrier gas to flow is placed in the partition (1) as follows. That is, when the opening (4) is placed in the lower portion of the partition (1), the opening (4) is placed in a position located at one-third or less, preferably one-fifth or less, and more preferably one-tenth or less of the internal height of the packing container measured from the internal bottom thereof. Further, when the opening (4) is placed in the upper portion of the partition (1), the opening (4) is placed in a position located at two-third or more, preferably four-fifth or more, and more preferably nine-tenth or more of the internal height of the container measured from the internal bottom thereof.

In the container for packing employed in the packing method of the present invention, the carrier gas flows through each of the partitioned spaces in the above structure and is drown from the carrier gas outlet (3).

Figure 2:
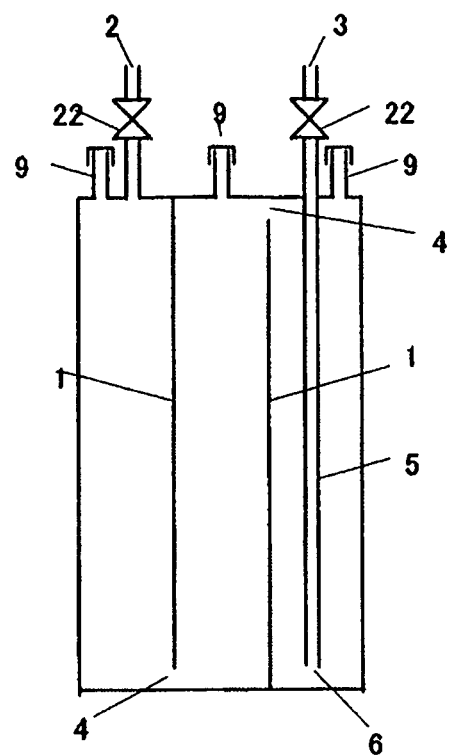
Figure 2:
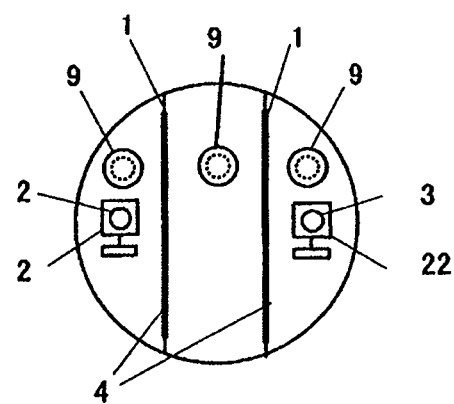
Figure 3:
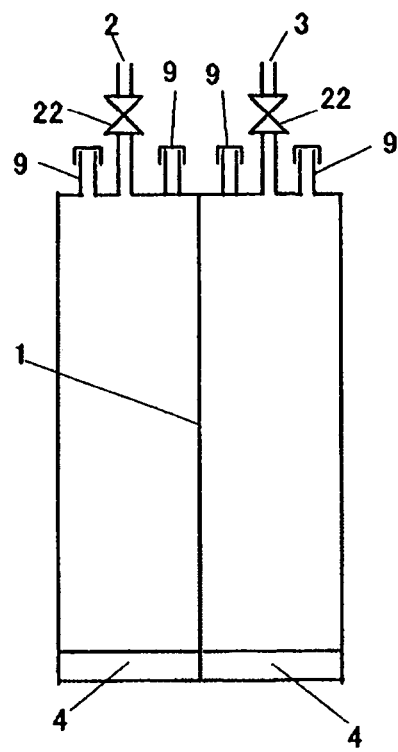
Figure 3:
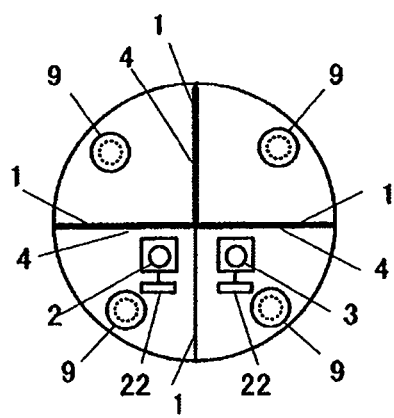
Figure 4:
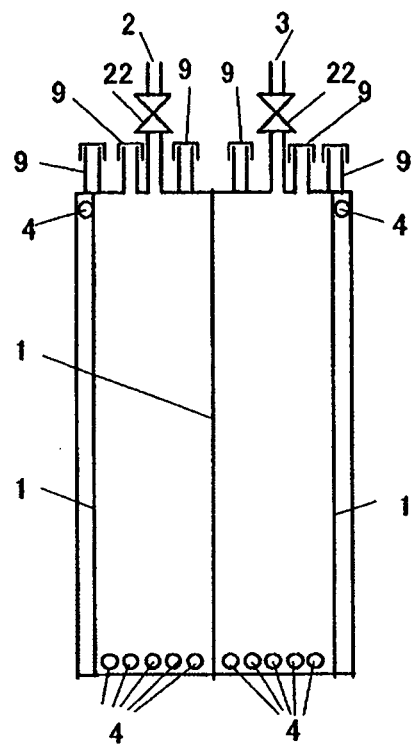
Figure 4:
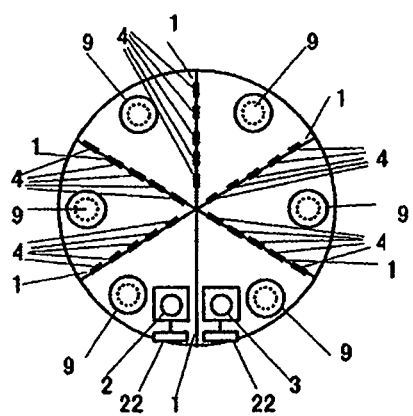

In the container for packing employed in the present invention, examples of the partition (1) having the abovementioned opening (4) include the structure shown in FIG. 1 in the case where the container has one partition (1), the structure shown in FIG. 2 in the case where the container has two partitions (1), and the structures shown in FIGS. 3 and 4 in the case where the container has three or more partitions (1).

Further, depending on the position of the opening (4) provided in the partition (1), a flow passage (5) may be provided in each of the carrier gas inlet (2) and the carrier gas outlet (3).

The flow passage (5) is provided for allowing the carrier gas to flow throughout all the spaces from the inlet (2) to the outlet (3) via the opening (4). Examples of the container having the structure in which the flow passage (5) is provided in each of the inlet (2) and the outlet (3) include the structures shown in FIGS. 7 and 8.

Figure 9:
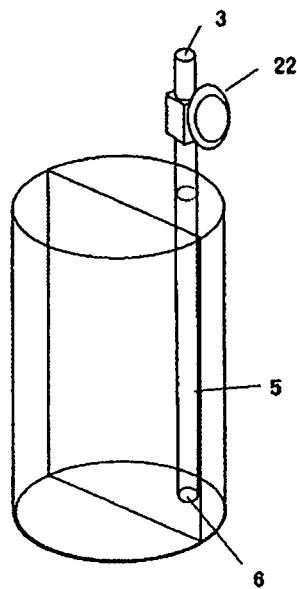
Figure 9:
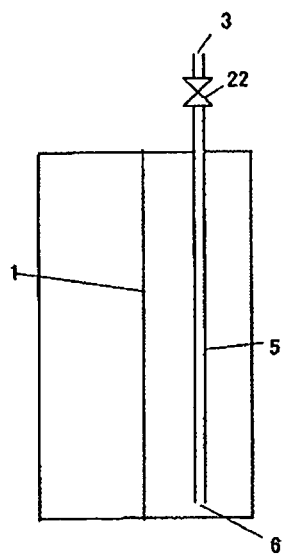
Figure 10:
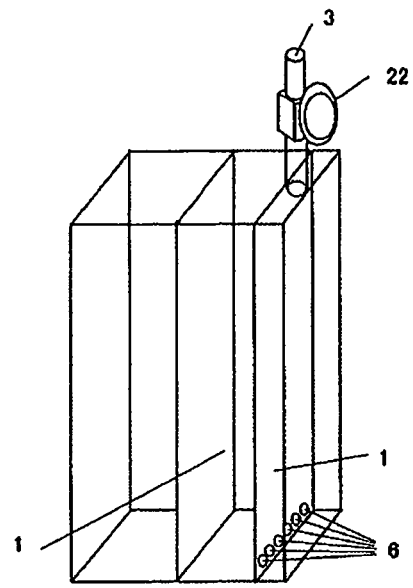
Figure 10:
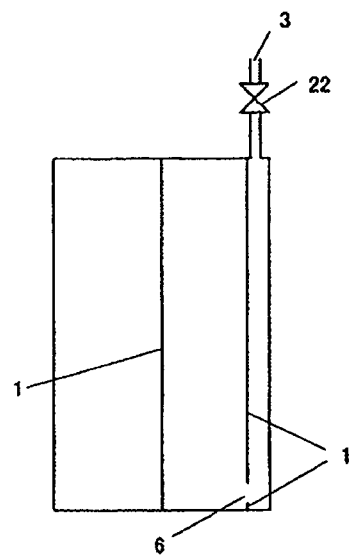
Figure 11:
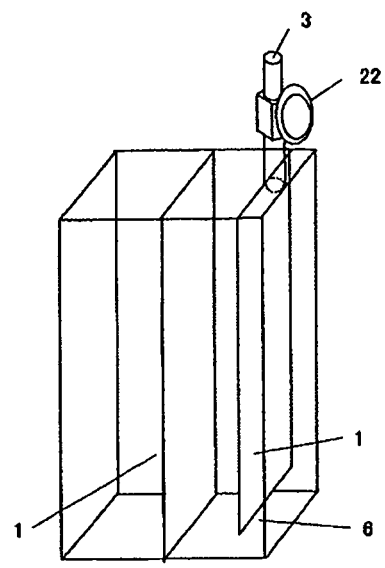
Figure 11:
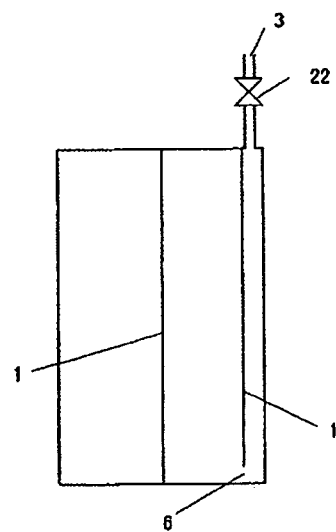

Examples of the abovementioned flow passage (5) which can be employed include a tubular flow passage shown in FIG. 9 and a flow passage having a lower flow passage opening (6) placed in the lower portion of the structure partitioned by the partition (1) as shown in FIG. 10 or 11. Further, the flow passage (5) may be a combination of the flow passage having the tubular structure and the flow passage having the lower flow passage opening (6) placed in the lower portion of the structure partitioned by the partition (1).

Desirably, the lower flow passage opening (6) of the flow passage (5) is placed in a position located at one-third or less, preferably one-fifth or less, and more preferably one-tenth or less of the internal height of the container measured from the internal bottom thereof.

The manner of the carrier gas flow in the container for packing employed in the packing method of the present invention will be described with reference to FIG. 1. First, the carrier gas is introduced from the carrier gas inlet (2) and then flows through the space having the inlet (2). After the carrier gas is allowed to flow through each of the spaces via the opening (4), the gas is drawn from the carrier gas outlet (3) and is supplied to an MOCVD apparatus. In this case, the manner of the carrier gas flow has been described with reference to FIG. 1. However, if the container for packing is partitioned into three or more spaces as shown in FIGS. 2 to 4, the carrier gas flows therethrough via the corresponding opening (4) provided in each of the partitions (1).

Figure 7:
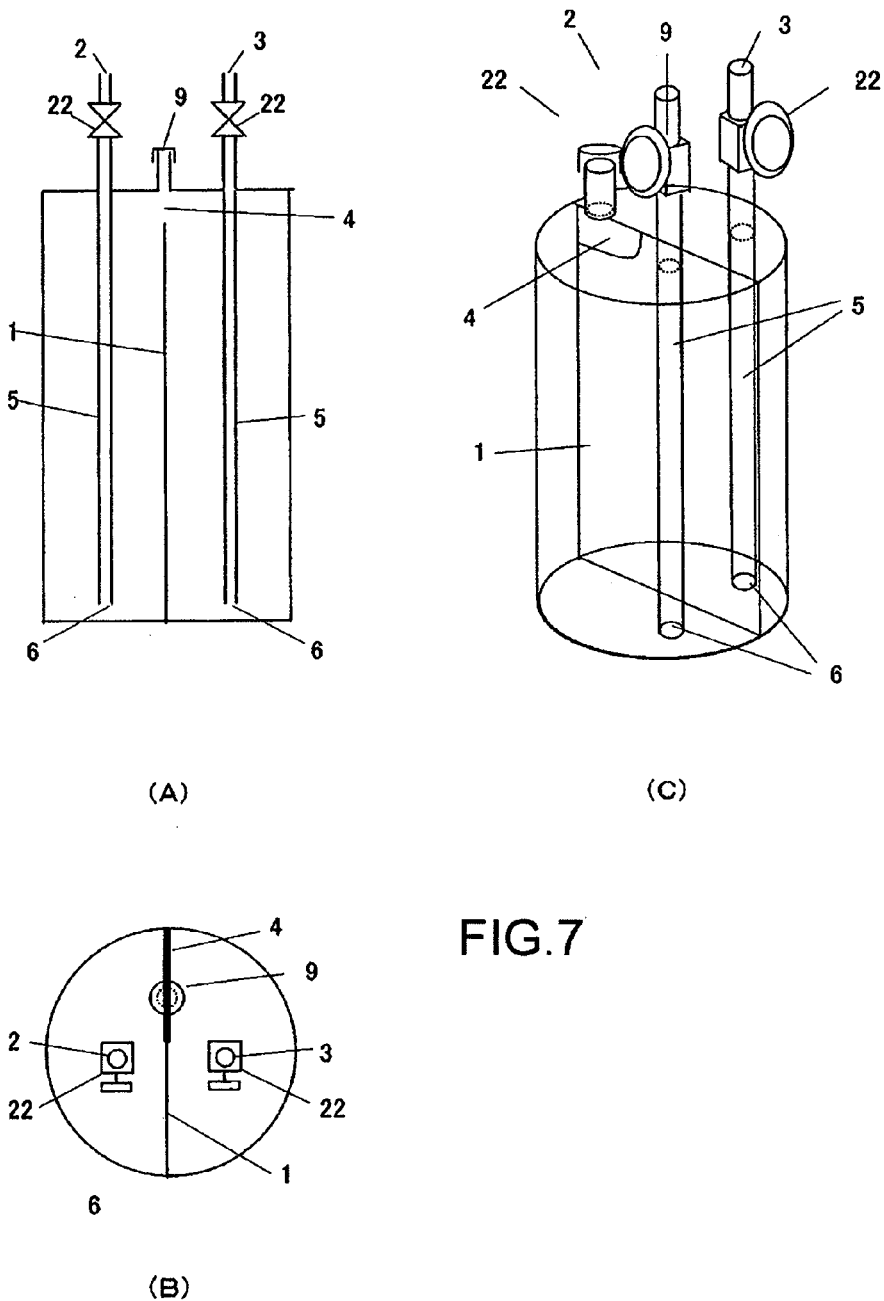
Figure 8:
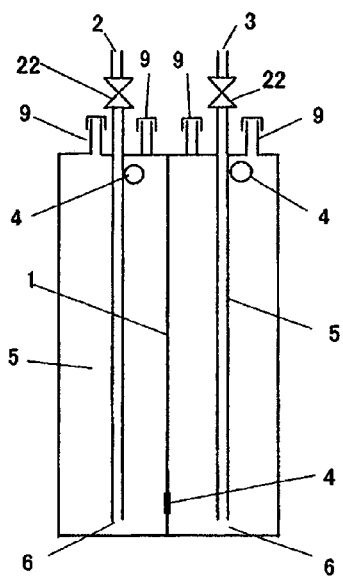
Figure 8:
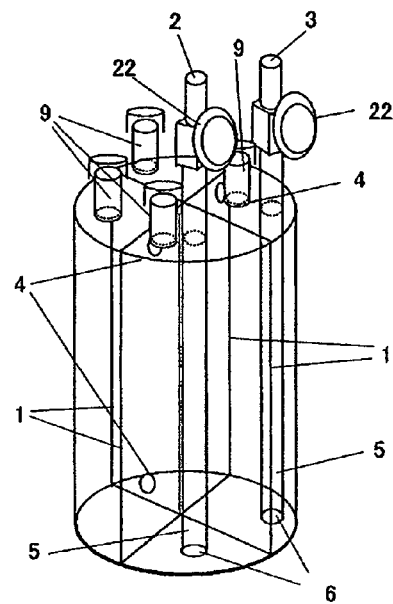
Figure 8:
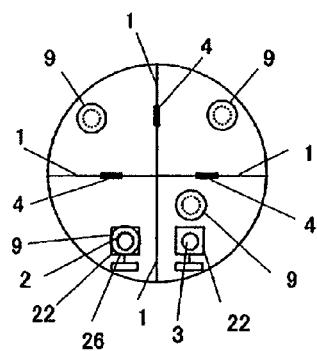

The manner of the flow will be described for the structure having the flow passage (5) provided in each of the carrier gas inlet (2) and the carrier gas outlet (3) as shown in FIG. 7. In this case, the carrier gas is introduced from the carrier gas inlet (2) and then passes through the flow passage (5). Subsequently, the gas flows through the space having the inlet (2). After the carrier gas is allowed to flow through each of the spaces via the opening (4), the gas flows through the flow passage (5) provided in the carrier gas outlet (3) and is drawn from the outlet (3). Subsequently, the carrier gas is supplied to an MOCVD apparatus.

Figure 12:
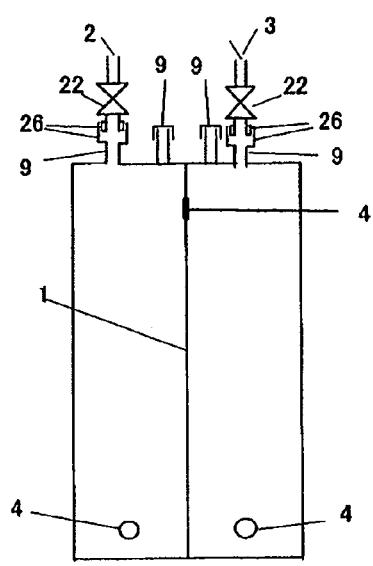
Figure 12:
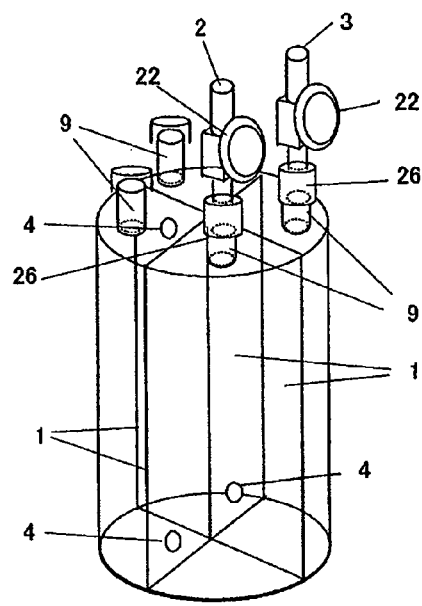
Figure 12:
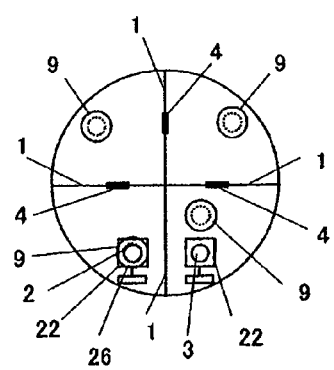

Moreover, in the container for packing the solid organometallic compound employed in the present invention, a packing opening (9) may be provided for packing the solid organometallic compound into the spaces formed inside the container by partitioning the container by the partition (1). By providing the packing opening (9), the solid organometallic compound can be fed as solid. In the present invention, the packing opening of the container may be provided in, for example, the top portion of the container as shown in FIGS. 1 to 4. Also, the structure of the container may be designed such that the carrier gas inlet (2) and/or the carrier gas outlet (3) can be detached from the container. In this structure, the inlet (2) and/or the outlet (3) can also serve as the packing opening (9). The detached inlet (2) and/or the detached outlet (3) can again be connected to the container via a connecting member (26) for subsequent use. Examples of this structure include the structure shown in FIG. 12 in which the separable connecting member (26) serving as the packing opening is provided between the carrier gas inlet (2) and the container. The inlet (2) is again connected to the packing container via this connecting member (26) for subsequent use.

In the container for packing employed in the packing method of the present invention, an openable-closable valve (22) may be provided in, for example, each of the carrier gas inlet (2) and the carrier gas outlet (3), as shown in FIGS. 1 to 4. While the carrier gas is allowed to flow, each of the valves (22) is used in an open state. When the organometallic compound is not supplied, the valves are normally held in a closed state to prevent the solid organometallic compound from being contaminated by the outside environment and from sublimating and transpirating to the outside of the container.

As described above, the container for packing employed in the packing method of the present invention has a structure in which the inside thereof is partitioned into a plurality of spaces by the partition (1). In addition, the carrier gas introduced from the carrier gas inlet (2) passes through the solid organometallic compound packed into each of the spaces of the container and flows to the carrier gas outlet (3). In each of the spaces, the carrier gas flows from the top of the space to the bottom thereof. Since the inside of the container is partitioned into a plurality of partitioned spaces by the partition (1) as described above, the cross-sectional area of each space is reduced to thereby allow the carrier gas to sufficiently contact with the solid organometallic compound. Therefore, the contacting state of the carrier gas with the solid organometallic compound can be maintained steady without causing certain flow paths to be formed as in the conventional technology. Further, the solid organometallic compound can be stably supplied by the carrier gas from the container to an MOCVD apparatus at a constant concentration for a long period of time. Moreover, since the solid organometallic compound having the controlled grain size is packed into the container, the effect of the grain size control can be effectively utilized.

Moreover, in the packing method of the present invention, another container for packing the solid organometallic compound may be employed in addition to the above-described container for packing the compound. That is, the employable container for packing the solid organometallic compound has the carrier gas inlet and the carrier gas outlet. Also, this container is characterized by having a structure in which the inside of the container is partitioned into a plurality of vertical spaces. In the above structure, the carrier gas introduced from the carrier gas inlet flows through each of the vertical spaces as a downward flow formed by means of carrier gas flow direction inverting means and is discharged from the carrier gas outlet.

No particular limitation is imposed on the structure of the abovementioned container which can be employed in the present invention, so long as the inside space of the container is partitioned into a plurality of vertical spaces and the carrier gas flows through each of the vertical spaces as a downward flow.

Figure 21:
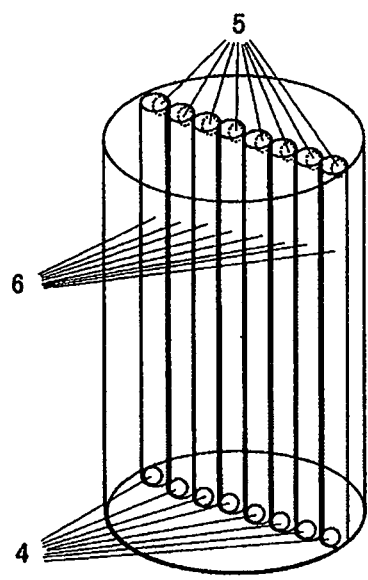
Figure 21:
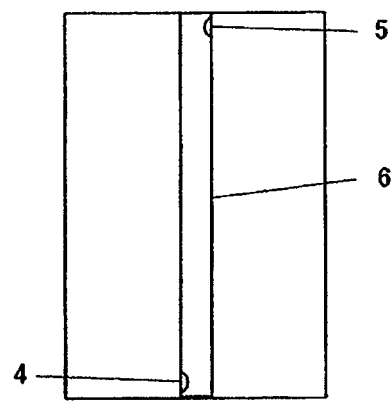
Figure 22:
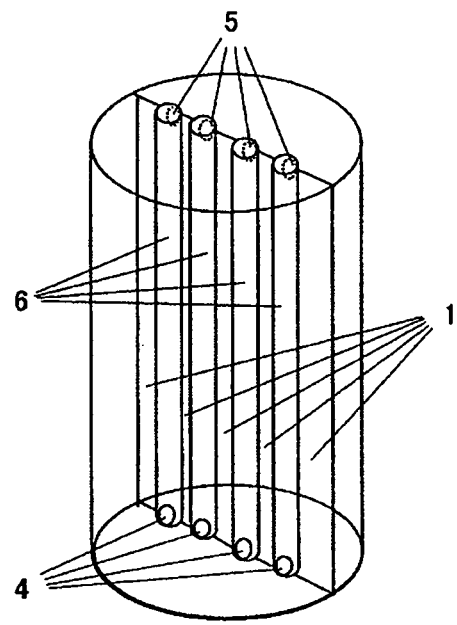
Figure 22:
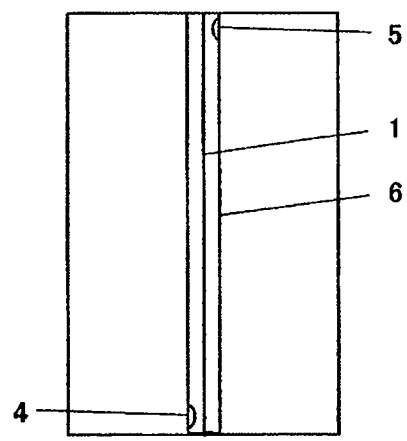
Figure 23:
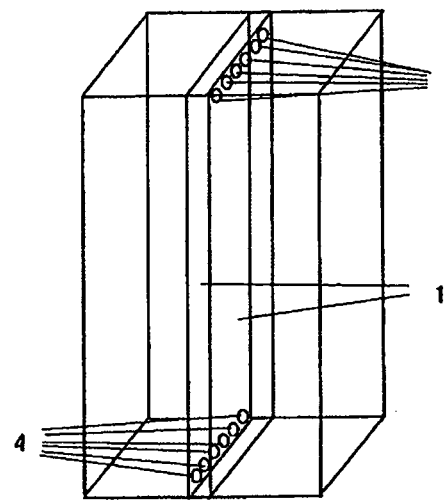
Figure 23:
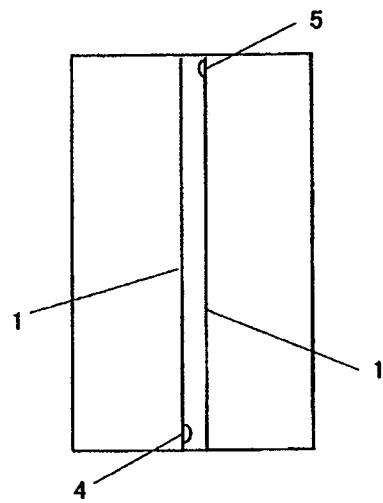
Figure 24:
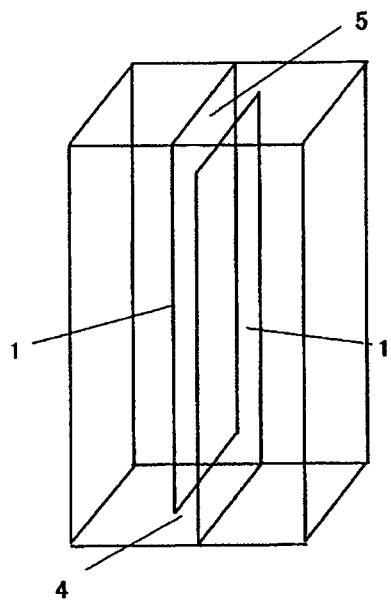
Figure 24:
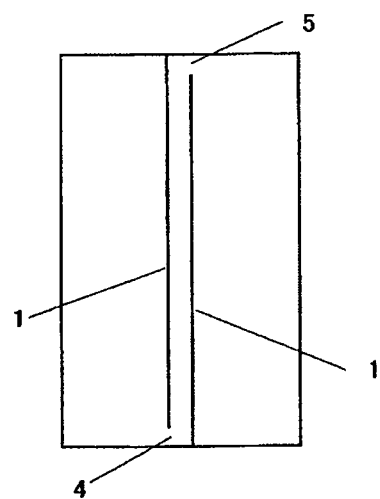

The carrier gas flow direction inverting means of the present invention is means for inverting the flow direction of the carrier gas which flows through one partitioned vertical space as a downward flow and for supplying the gas to the top portion of an adjacent vertical space as a downward flow. Specific examples of the carrier gas flow direction inverting means include, but not limited to, means in which a communication flow passage is provided in the partition as shown in FIGS. 13 to 20, means in which the partition is constituted by the communication flow passage as shown in FIGS. 21 and 22, and means in which the communication flow passage is constituted by the partition as shown in FIGS. 23 and 24.

Each of FIGS. 13 to 16 shows an example of the container for packing the solid organometallic compound employed in the present invention. As shown in FIGS. 13 to 16, the container for packing the compound employed in the packing method of the present invention has a structure in which the inside of the container is partitioned by at least one partition (1) in the vertical direction to form at least two partitioned spaces. The space may be partitioned by the partition (1) to form the partitioned spaces as in the manner, for example, shown in FIGS. 1 to 4.

In addition to the container having a cylindrical shape shown in FIGS. 13 to 16, the container for packing may have the exterior shape such as a triangular prism shape, a rectangular prism shape, a pentagonal prism shape, or a hexagonal prism shape.

Further, the container for packing solid organometallic compound employed in the packing method of the present invention has a structure having a carrier gas inlet (2) and a carrier gas outlet (3). The carrier gas inlet (2) communicates with one of the spaces formed by partitioning the inside of the container by the partition (1), and the carrier gas outlet (3) communicates with one of the rest of the spaces. Examples of the structure of this container include the structures shown in FIGS. 13 to 16. The carrier gas is introduced from the carrier gas inlet (2) into the container packed with the solid organometallic compound and is allowed to flow through the inside of the container. The carrier gas is then drawn from the carrier gas outlet (3) as a gas saturated with the organometallic compound and is supplied to an MOCVD apparatus. The placement positions of the carrier gas inlet (2) and the carrier gas outlet (3) in the container for packing may be determined depending on the manner of partitioning the space by the partition (1), the usage of the container, and the like. For example, the carrier gas inlet (2) and the carrier gas outlet (3) may be placed in the top portion of the container or in the side surface of the container.

The at least one partition (1) inside the container for packing of the present invention includes a partition (1) having a communication flow passage (6) having a lower opening (4) and an upper opening (5) as shown in FIGS. 13 to 16. The communication flow passage (6) is provided for allowing the carrier gas to flow from the carrier gas inlet (2) via each of the spaces inside the container to the carrier gas outlet (3), as shown in FIGS. 13 to 16.

Further, the container for packing of the present invention has a structure in which the carrier gas introduced inside the container is introduced from the lower opening (4) of the communication flow passage (6) and is discharged from the upper opening (5), as shown in FIGS. 13 to 16.

Since the container for packing of the present invention has the flow passage having the abovementioned structure, the carrier gas flows through each of the partitioned spaces and is discharged from the carrier gas outlet (3).

Further, the container for packing of the present invention has a discharging flow passage (8) having a lower opening (7) for discharging the carrier gas from the lower portion of the space having the carrier gas outlet (3) to the carrier gas outlet (3), as shown in FIGS. 13 to 16.

Figure 13:
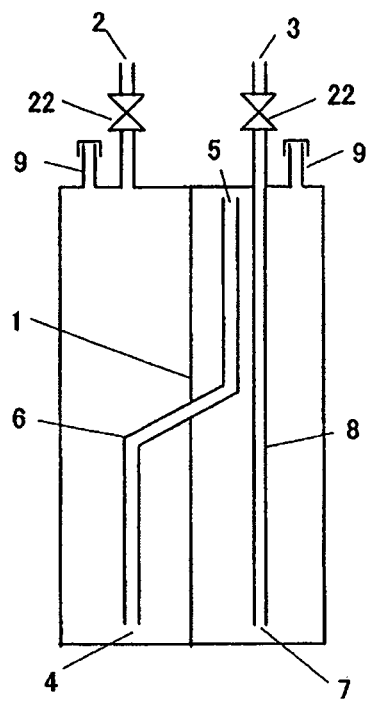
Figure 13:
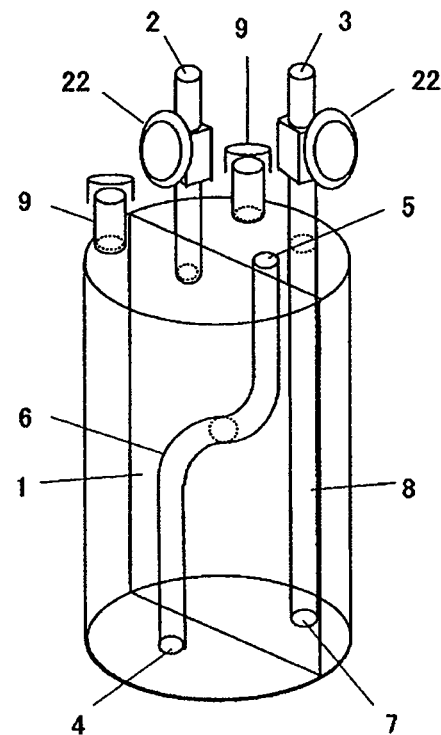
Figure 13:
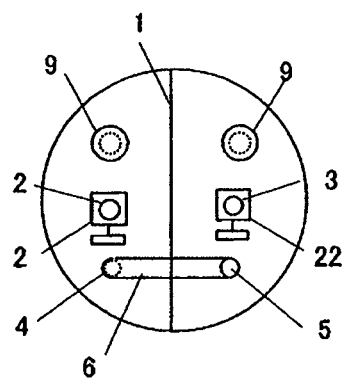
Figure 14:
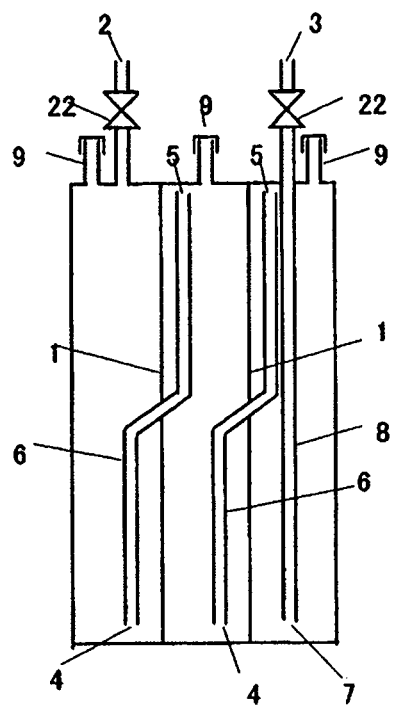
Figure 14:
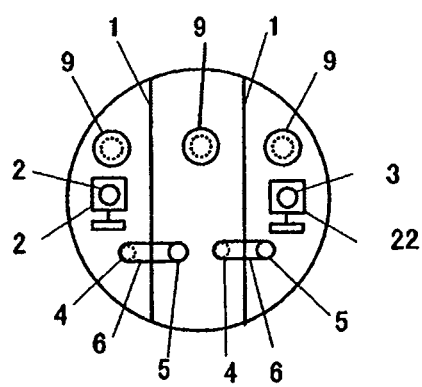
Figure 15:
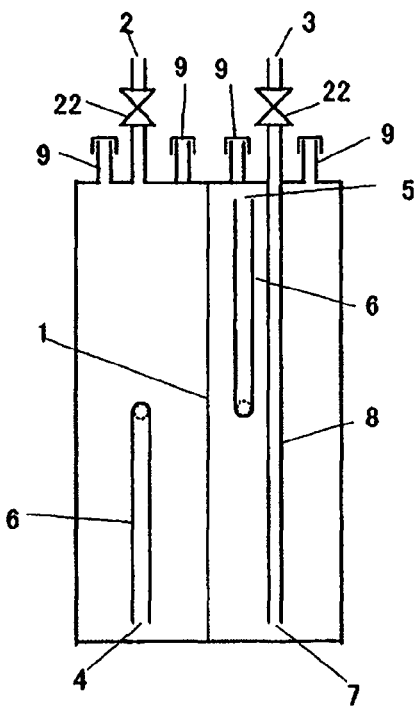
Figure 15:
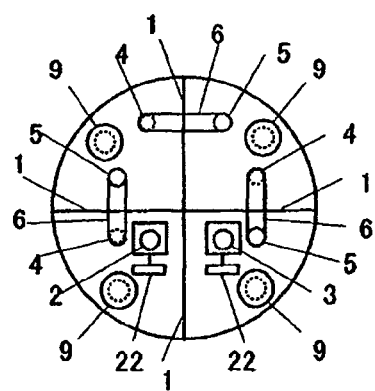
Figure 16:
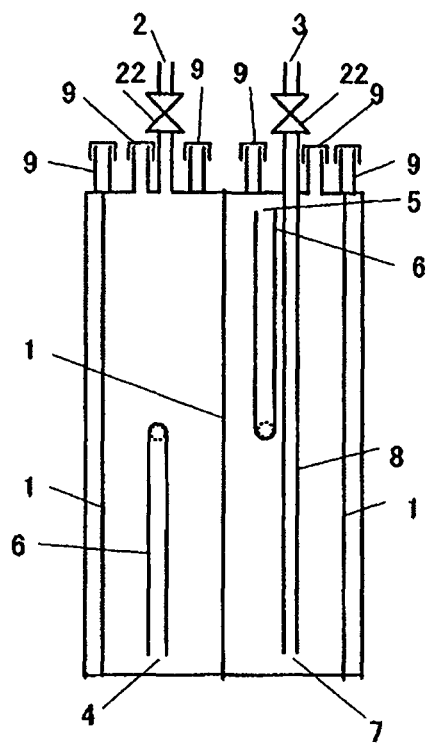
Figure 16:
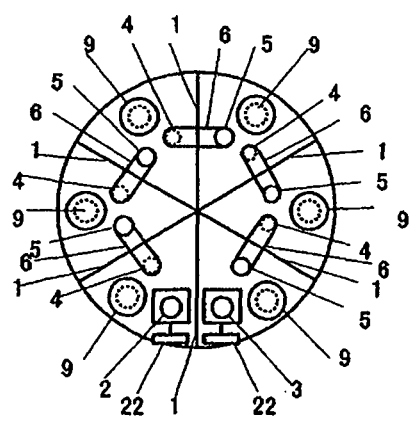
Figure 17:
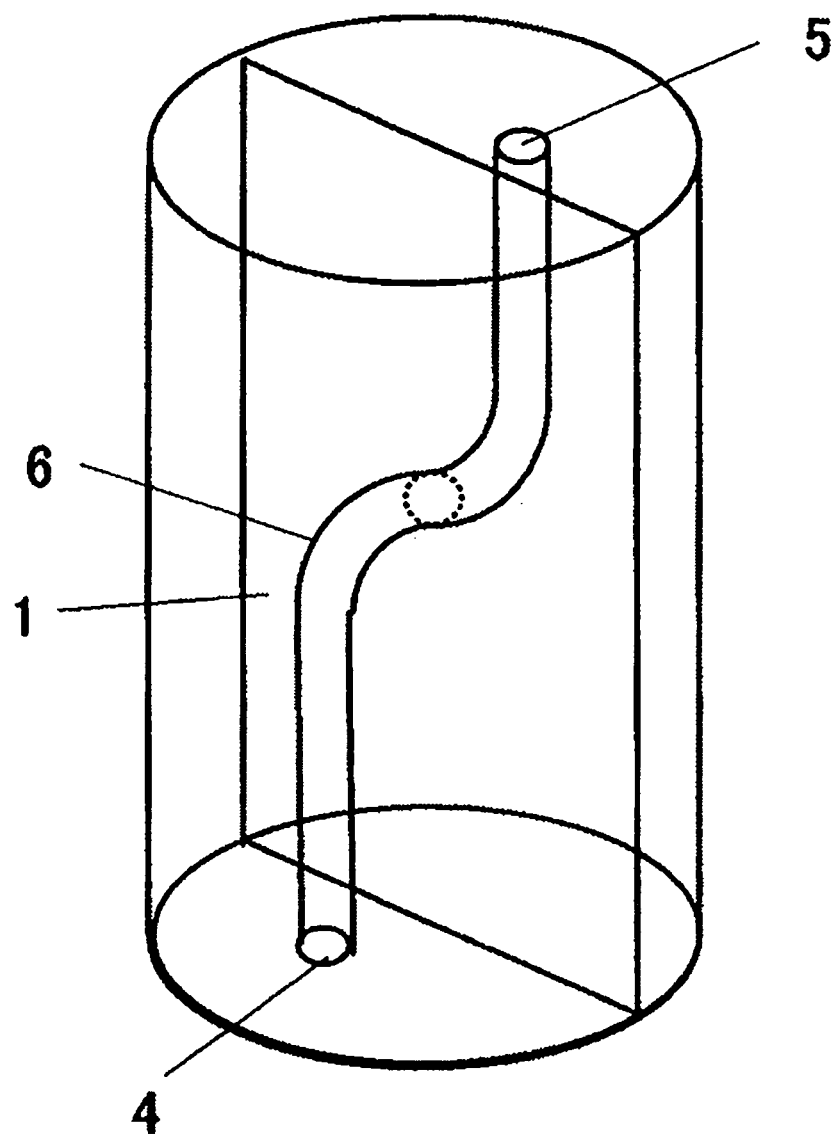
FIG. 17 is a perspective view showing another embodiment of a container for packing according to the present invention.
Figure 18:
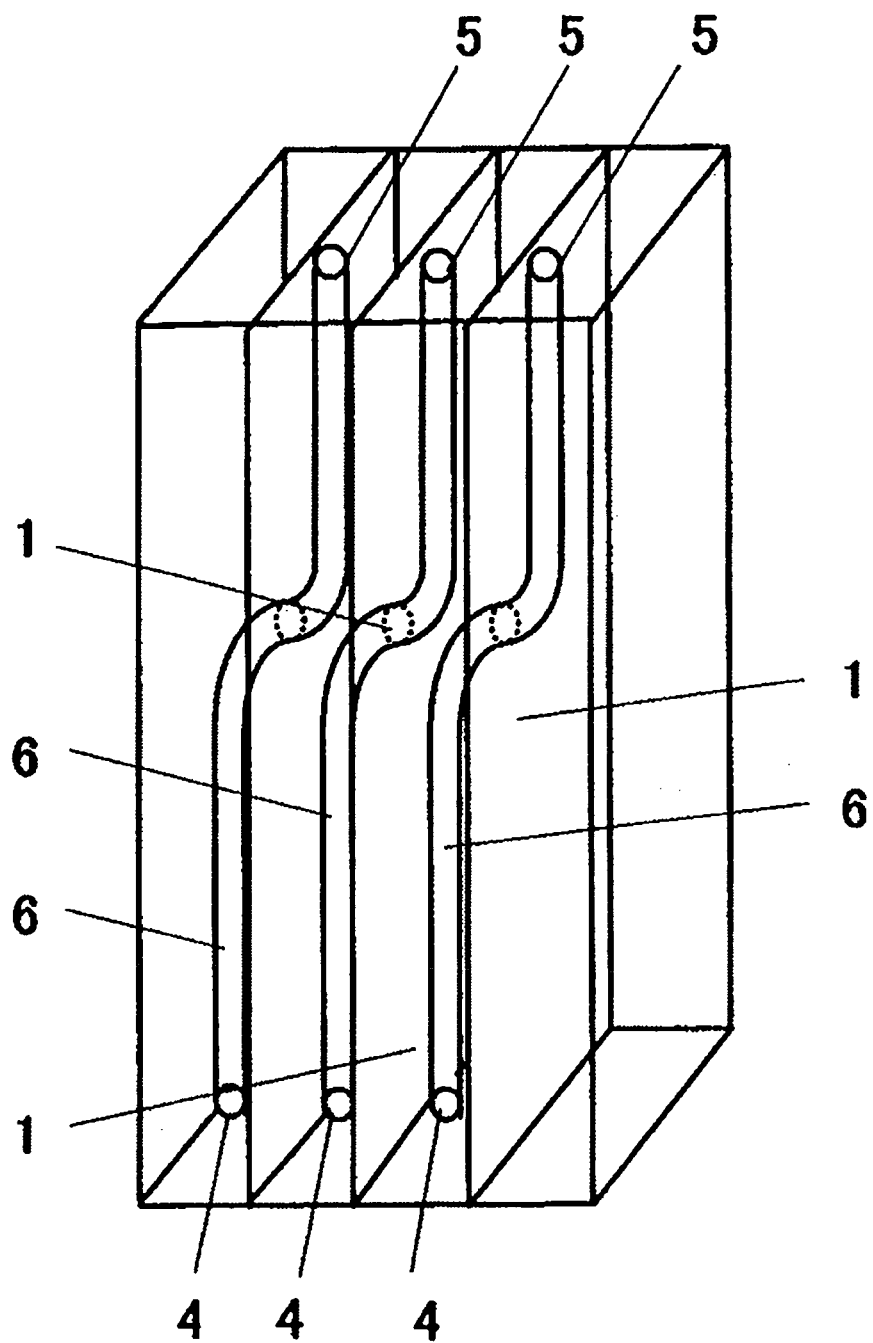
FIG. 18 is a perspective view showing another embodiment of a container for packing according to the present invention.
Figure 19:
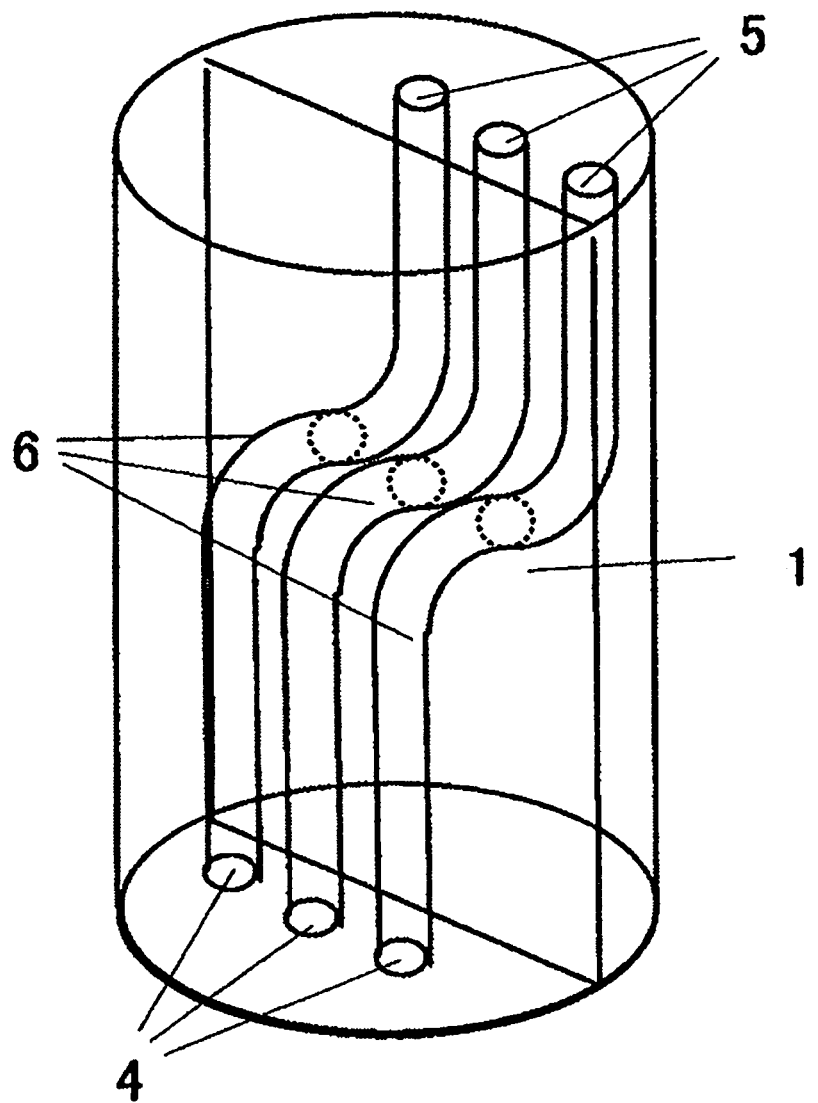
FIG. 19 is a perspective view showing another embodiment of a container for packing according to the present invention.
Figure 20:
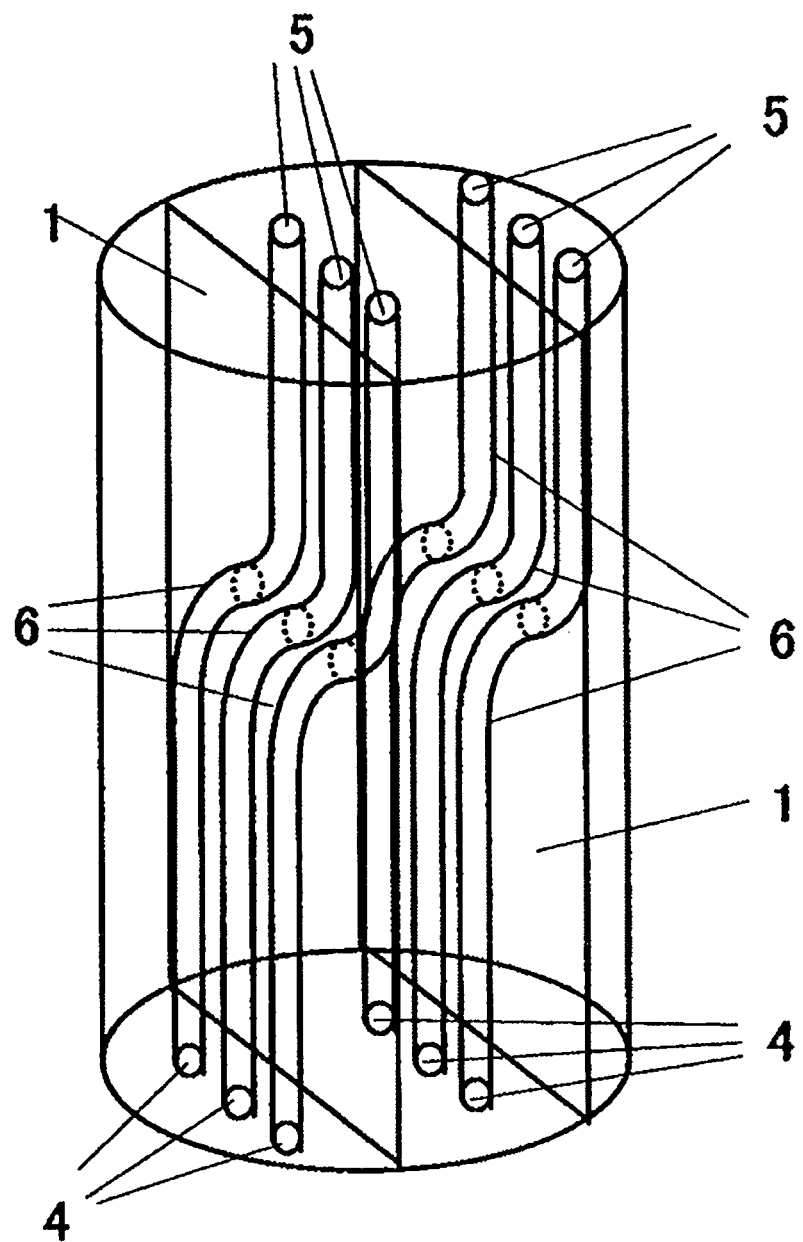
FIG. 20 is a perspective view showing another embodiment of a container for packing according to the present invention.

In the container for packing of the present invention, examples of the communication flow passage (6) and the discharging flow passage (8) include the structure shown in FIG. 13 in the case where the container has one partition (1), the structure shown in FIG. 14 in the case where the container has two partitions (1), and the structures shown in FIGS. 15 and 16 in the case where the container has three or more partitions (1).

In the container for packing the solid organometallic compound of the present invention, one or a plurality of, for example, tubular members shown in FIGS. 17 to 20 may be provided as the communication flow passage (6).

The manner of the carrier gas flow in the container for packing of the present invention will be described with reference to FIG. 13. First, the carrier gas is introduced from the carrier gas inlet (2) and then flows downward through the space having the inlet (2). The carrier gas then flows into the lower opening (4) of the communication flow passage (6) serving as the carrier gas flow direction inverting means, the lower opening (4) being provided near the bottom of the container. Subsequently, the carrier gas flows through the communication flow passage (6) as an upward flow and is supplied to the upper portion of the space having the carrier gas outlet (3). The carrier gas supplied to the upper portion of the space having the outlet (3) flows downward. The gas then flows into the lower opening (7) of the discharging flow passage (8) and flows upward through the passage (8), the lower opening (7) being located around the lower portion of the space having the outlet (3). Subsequently, the gas is drawn from the carrier gas outlet (3) and is supplied to an MOCVD apparatus. In this case, the manner of the carrier gas flow has been described with reference to FIG. 13. However, if the container for packing is partitioned into three or more spaces as shown in FIGS. 14 to 16, the carrier gas flows therethrough from the upper portion to the lower portion as a downward flow via the corresponding communication flow passage (6) provided in each of the partitions (1).

Also, similar effects are achieved in the container having a structure in which the partition (1) serves also as the communication flow passage (6) as shown in FIGS. 21 to 24. Examples of such a structure include the structures shown in FIGS. 21 to 24. In the structures shown in FIGS. 21 and 22, a plurality of tubular structures are arranged parallel to each other in the vertical direction of the container. The space between the tubular structures is packed by bringing the tubular structures into contact with each other as shown in FIG. 21 or by placing the partition (1) as shown in FIG. 22. In the structures shown in FIGS. 21 and 22, an opening serving as the lower opening (4) is provided in the lower portion of the tubular structure on the side facing the upstream side of the carrier gas flowing direction. Further, an opening serving as the upper opening (5) is provided in the upper portion of the tubular structure on the side facing the downstream side. On the other hand, each of the structures shown in FIGS. 23 and 24 has two partitions (1). In this case, an opening serving as the lower opening (4) is provided in the lower portion of the partition (1) located in the upstream side of the carrier gas flowing direction. Also, an opening serving as the upper opening (5) is provided in the upper portion of the partition (1) located in the downstream side. The communication flow passage (6) may be constituted by a combination of the tubular structure and the structure in which the partition (1) serves also as the passage (6).

Figure 25:
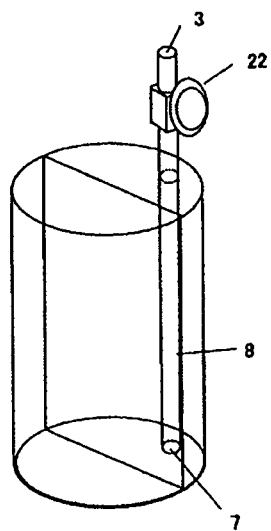
Figure 25:
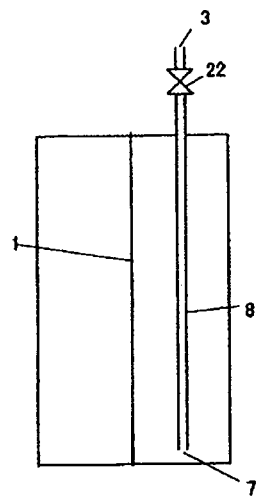
Figure 26:
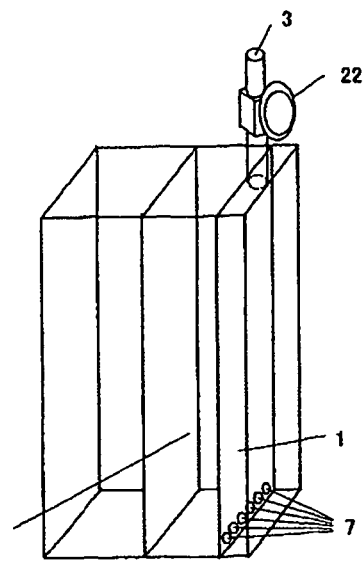
Figure 26:
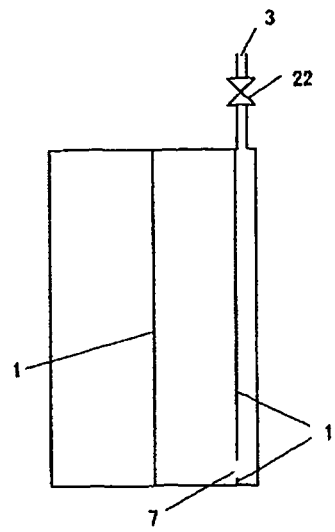
Figure 27:
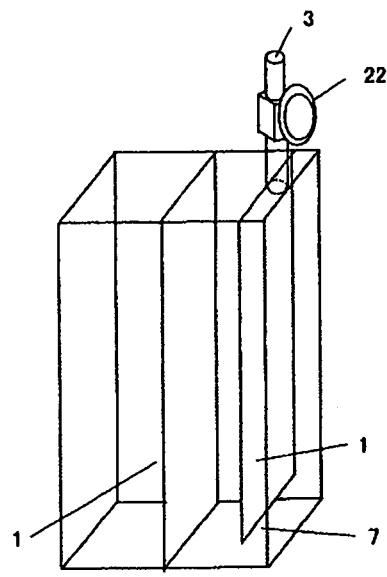
Figure 27:
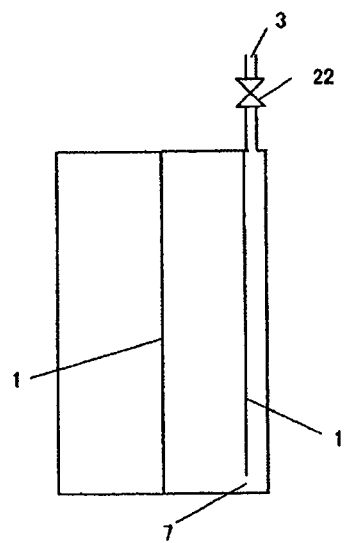

Further, in the container for packing of the present invention, the discharging flow passage (8) has the lower opening (7) for discharging the carrier gas from the lower portion of the space having the carrier gas outlet (3) to the outlet (3). Examples of the structure which can be employed as the discharging flow passage (8) include the structures shown in FIGS. 25 to 27. The tubular structure shown in FIG. 25 has an opening in the lower portion thereof. In the structures shown in FIGS. 26 and 27, the lower opening (7) is provided in the lower portion of the structure partitioned by the partition (1). The discharging flow passage (8) may be constituted by a combination of the tubular structure and the structure having the lower opening (7) provided in the lower portion of the structure partitioned by the partition (1).

Moreover, in the container for packing the solid organometallic compound of the present invention, as described above, the communication flow passage (6) has the lower opening (4) and the upper opening (5) each for allowing the carrier gas to flow. In addition, the discharging flow passage (8) has the lower opening (7) for discharging the carrier gas from the lower portion of the space having the carrier gas outlet (3) to the outlet (3). Also, the carrier gas introduced from the carrier gas inlet (2) flows therefrom to the carrier gas outlet (3) via the spaces packed with the solid organometallic compound, the communication flow passage (6), and the discharging flow passage (8) having the lower opening (7) for discharging the carrier gas to the outlet (3). No particular limitation is imposed on the positions of the upper opening (5) and the lower opening (4) of the communication flow passage (6), so long as the carrier gas can sufficiently flow from the carrier gas inlet (2) to the carrier gas outlet (3) as described above. In this case, the carrier gas must be brought into sufficient contact with the packed solid organometallic compound, and the compound must be stably supplied without causing problems. Particularly, in order to bring the carrier gas into contact with the packed solid organometallic compound for effectively achieving saturation, the lower opening (4), the upper opening (5), and the lower opening (7) are desirably placed as follows. That is, in the communication flow passage (6) having the openings (4) and (5) for allowing the carrier gas to flow, the lower opening (4) is placed in a position located at one-third or less, preferably one-fifth or less, and more preferably one-tenth or less of the internal height of the container measured from the internal bottom thereof. Further, in the passage (6), the upper opening (5) is placed in a position located at two-third or more, preferably four-fifth or more, and more preferably nine-tenth or more of the internal height of the container measured from the internal bottom thereof. In addition, as described above, the discharging flow passage (8) has the lower opening (7) for discharging the carrier gas from the lower portion of the space having the carrier gas outlet (3) to the outlet (3). In the above passage (8), the lower opening (7) is placed in a position located at one-third or less, preferably one-fifth or less, and more preferably one-tenth or less of the internal height of the container measured from the internal bottom thereof.

When the container for packing of the present invention is packed with the solid organometallic compound and employed for supplying the compound to an MOCVD apparatus, the compound is packed into the spaces inside the container.

Moreover, in the container for packing the solid organometallic compound of the present invention, a packing opening (9) may be provided for packing the compound into the spaces formed inside the container by partitioning the container by the partition (1). By providing the packing opening (9), the solid organometallic compound can be fed as solid. In the present invention, the packing opening of the container may be provided in, for example, the upper portion of the container as shown in FIGS. 13 to 16. Also, the structure of the container may be designed such that the carrier gas inlet (2) and/or the carrier gas outlet (3) can be detached from the container. In this structure, the inlet (2) and/or the outlet (3) can also serve as the packing opening (9). The detached inlet (2) and/or the detached outlet (3) can again be connected to the container via the connecting member (26) for subsequent use. In this case, if the discharging flow passage (8) connected to the carrier gas outlet (3) is detachable, the solid organometallic compound can be easily packed. Examples of this structure include the structure shown in FIG. 28 in which the separable connecting member (26) serving as the packing opening is provided between the carrier gas inlet (2) and the container. The carrier gas inlet (2) is again connected to the container via this connecting member (26) for subsequent use.

In the container for packing of the present invention, the openable-closable valve (22) may be provided in, for example, each of the carrier gas inlet (2) and the carrier gas outlet (3), as shown in FIGS. 13 to 16. While the carrier gas is allowed to flow, each of the valves (22) is used in an open state. When the organometallic compound is not supplied, the valves are normally held in a closed state to prevent the solid organometallic compound from being contaminated by the outside environment and from sublimating and transpirating to the outside of the container.

As described above, the container for packing employed in the packing method of the present invention has a structure in which the inside thereof is partitioned into a plurality of spaces by the partition (1). In addition, the carrier gas introduced from the carrier gas inlet (2) passes through the solid organometallic compound packed into each of the spaces of the container and flows to the carrier gas outlet (3). In each of the spaces, the carrier gas flows from the upper portion of the space to the bottom portion thereof. Since the inside of the container is partitioned into a plurality of partitioned spaces by the partition (1) as described above, the cross-sectional area of each space is reduced to thereby allow the carrier gas to sufficiently contact with the solid organometallic compound. Therefore, the contacting state of the carrier gas with the solid organometallic compound can be maintained steady without causing certain flow paths to be formed as in the conventional technology. Further, the solid organometallic compound can be stably supplied by the carrier gas from the container to an MOCVD apparatus at a constant concentration for a long period of time. Moreover, since the solid organometallic compound having the controlled grain size is packed into the present container, the effect of the grain size control can be effectively utilized.

When the container for packing is packed with the solid organometallic compound by means of the present method for packing the solid organometallic compound into the container for packing the compound and is employed for supplying the compound to an MOCVD apparatus, the compound is packed into the spaces inside the container.

In the present method for packing the solid organometallic compound into the container for packing the compound, a conventionally known method may be employed without any change as a method for packing the solid organometallic compound into the spaces inside the container. Examples of the method which can be employed include: a method in which the solid organometallic compound is introduced and packed into the container by sublimation; a method in which the organometallic compound is introduced and packed into the container as a saturated vapor in a carrier gas; and a method in which the organometallic compound is heated above the melting temperature to liquefy and is introduced into the container. However, in many cases, the grain size of the solid organometallic compound is not satisfactorily controlled in these methods.

Normally, when the solid organometallic compound having the controlled grain size employed in the present invention is packed into the container for packing the compound, the abovementioned specific operations are not required. By employing the container having the packing opening for packing the solid organometallic compound into the spaces inside thereof, the solid organometallic compound having the grain size controlled outside the container can be introduced into the container as solid.

If the solid organometallic compound is a material which is, for example, flammable in air, the operation for packing the compound from the packing opening may be performed under the atmosphere of a gas, such as nitrogen, argon, or helium, inert to the compound.

As the solid organometallic compound which can be employed for packing the container of the present invention, the solid organometallic compounds employed in a conventionally known container can, of course, be employed. In addition, other solid organometallic compounds can be employed, so long as the compound is solid under supply conditions and has a saturated vapor pressure enough to supply the desired amount of the compound to the carrier gas under the operating temperature and pressure which are employed in the supply by use of the carrier gas. Representative examples of the solid organometallic compound include alkyl metal compounds, metallocene compounds, β-diketone complexes, and adduct compounds. Specifically, examples of the solid organometallic compound include: alkyl metal compounds such as trimethylindium, dimethylchloroindium, triphenylaluminum, triphenylbismuth, and tert-butyllithium; metallocene compounds such as cyclopentadienylindium, bis(cyclopentadienyl)magnesium, bis(cyclopentadienyl)manganese, and ferrocene; β-diketone complexes such as barium acetylacetonato complex, strontium acetylacetonato complex, copper acetylacetonato complex, calcium acetylacetonato complex, barium dipivaloylmethanato complex, strontium dipivaloylmethanato complex, copper dipivaloylmethanato complex, yttrium dipivaloylmethanato complex, and calcium dipivaloylmethanato complex; and adduct compounds such as trimethylindium-trimethylarsine adduct, trimethylindium-trimethylphosphine adduct, and barium dipivaloylmethanato-1,10-phenanthroline adduct.

Further, the operating pressure for the solid organometallic compound-packed container packed by means of the packing method of the present invention can be adapted to the conditions employed in a conventionally known container without any change. No particular limitation is imposed on the pressure, so long as the solid organometallic compound is stably supplied to an MOCVD apparatus for a long period of time under the conditions. Any of elevated, normal, and reduced pressures can be employed, but a pressure from around normal pressure to reduced pressure is normally employed.

Further, the operating temperature for the solid organometallic compound-packed container packed by means of the packing method of the present invention can be adapted to the conditions employed in a conventionally known container without any change. Under the adaptable conditions, the organometallic compound normally employed is solid and has a saturated vapor pressure enough to supply the desired amount thereof to a carrier gas.

In the solid organometallic compound-packed container packed by means of the packing method of the present invention, any carrier gas employed in a conventionally known container can be employed. Examples of the carrier gas include hydrogen gas and inert gases such as nitrogen, argon, and helium.

Further, in the solid organometallic compound-packed container packed by means of the packing method of the present invention, a known packing material can be employed which is employed together with a solid organometallic compound to pack into a conventionally known container. For example, stainless steel, glass, ceramics, fluororesin, and the like can be employed as a material for the packing material. Of these, stainless steel is preferably employed. In addition, the packing material which can be employed may have various shapes including round shapes, polygonal shapes, cylindrical shapes, coil-like shapes, spring-like shapes, spherical shapes, and the like. Examples of the packing material include various packings for distillation such as Dixon packing, Helipack, and Fenske. In addition, fibrous packing materials may be employed.

In the present invention, the packing material has a size which allows the packing material to pass through the opening of the packing inlet provided in the container. The size is normally 0.8 to 8 mm, preferably 0.8 to 6 mm, and more preferably 0.8 to 5 mm.

Also, these packing materials can be packed into the container of the present invention by means of a conventionally known method and can be employed together with the solid organometallic compound.

Moreover, the packing method of the present invention can be employed as a method for packing not only a solid organometallic compound but also general solid materials having proper vapor pressure such as solid inorganic compounds, solid organic compounds, and solid metals. In other words, the packing method of the present invention can be employed as a packing method by use of a carrier gas for extracting a solid material other than the solid organometallic compound as a gas saturated with the material.

The present invention will next be described in detail by way of examples.

Example 1

As the solid organometallic compound, trimethylindium was employed.

Trimethylindium was pulverized in nitrogen atmosphere and sieved through a sieve having a mesh size of 4.75 mm to thereby obtain the grains of trimethylindium having a grain size of 4.75 mm or less. Subsequently, the grains of trimethylindium having a grain size of 1 mm or less was removed by use of a sieve having a mesh size of 1 mm from the sieved trimethylindium grains having a grain size of 4.75 mm or less to thereby prepare the grains of trimethylindium having a grain size of 4.75 mm or less.

The grain size of the grains of trimethylindium was determined, and it was found that 50% or more of the grains have a grain size of 2.5 to 4.75 mm.

Supply stability was tested by use of the thus-obtained trimethylindium grains of which comprise grains having a grain size of 2.5 to 4.75 mm.

The supply stability test was performed by use of the following method.

Figure 28:
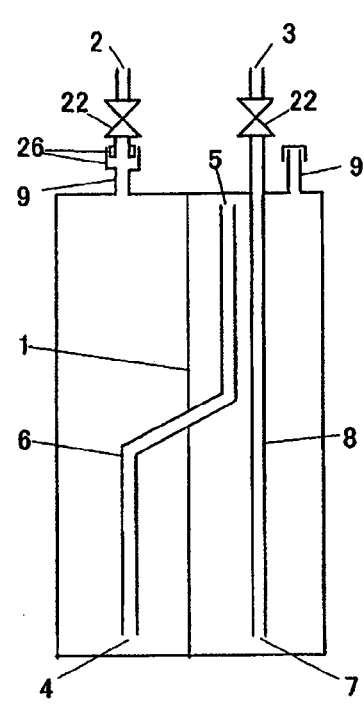
Figure 28:
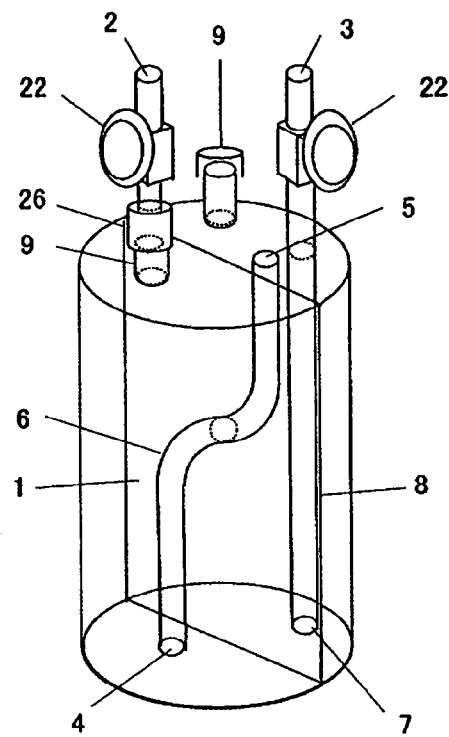
Figure 28:
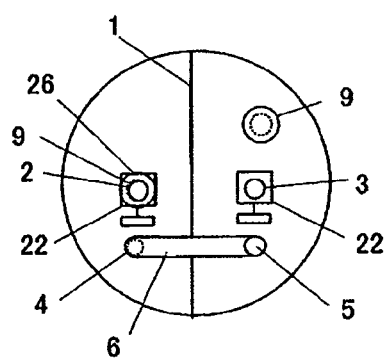

Under nitrogen atmosphere, a container for packing made of SUS and having an outer diameter of 60.5 mmφ shown in FIG. 28 was packed from the packing opening (9) with 200 g of trimethylindium prepared by controlling the grain size by means of the abovementioned method, 263 g of a stainless steel packing material having dimensions of 0.9 mm×1.8 mm×1.8 mm, and 97 g of a stainless steel packing material having dimensions of 2.5 mm×5.0 mm×5.0 mm. In this packing operation, the connecting member (26) was separated to form the packing opening (9).

Subsequently, the carrier gas outlet (3) was connected to a trap for trapping trimethylindium. In this case, the trap was cooled by dry ice-methanol. Piping connecting the carrier gas outlet (3) and the cooled trap was heated to prevent trimethylindium from being precipitated in the piping. The container containing trimethylindium and the packing materials was immersed into a temperature controlled bath set at 25° C. Under the conditions that the pressure inside a supply stability testing apparatus was adjusted to about atmospheric pressure, nitrogen gas was fed from the carrier gas inlet (2) of the container at a flow rate of 500 cc/min. The weight of trimethylindium trapped in the trap cooled by dry ice-methanol was measured every eight hours. In addition, the gas concentration of the gas phase of the carrier gas containing the vapor of trimethylindium was measured by means of an ultrasonic type gas concentration meter (EPISON (product name): product of Thomas Swan Scientific Equipment Ltd.).

Figure 29:
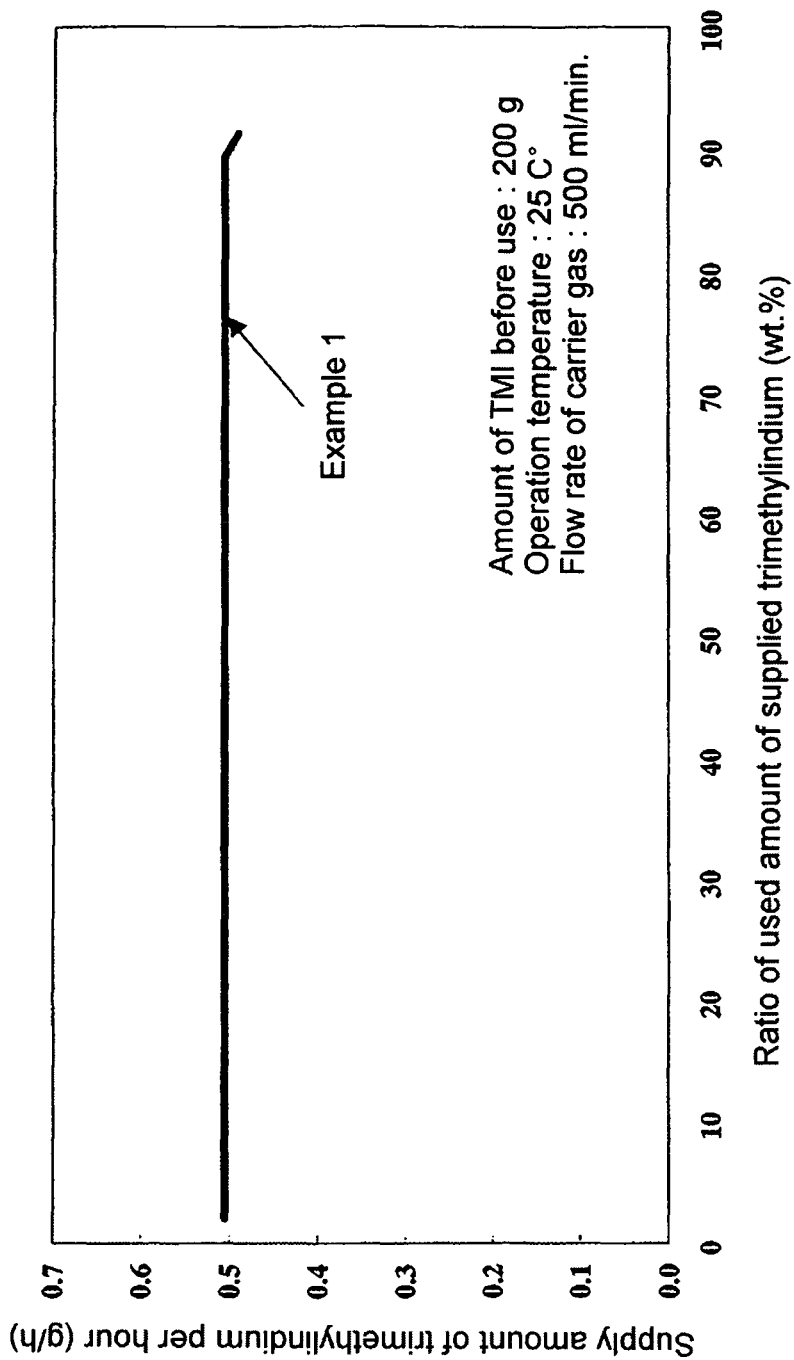
FIG. 29 is a graph showing the supply stability test results for trimethylindium in Example 1 (the relationship between the ratio of the used amount of the supplied trimethylindium and the supply amount of trimethylindium per hour)

The results are shown in FIG. 29. The vertical axis of the graph shown in FIG. 29 represents the supply amount of trimethylindium per hour, and the horizontal axis represents the ratio of the used amount of the supplied trimethylindium in percent by weight.

As can be seen from the supply stability test results, when the packing method of the present invention was employed, the supply rate of trimethylindium was stable up to a ratio of the used amount of 91 wt. %.

As described above, by employing the solid organometallic compound containing grains having a grain size of 2.5 to 4.75 mm, the compound can be stably supplied at a constant concentration. Further, the ratio of the used amount of the solid organometallic compound can be increased under the conditions that the stable supply rate is obtained. Therefore, the period of time in which the solid organometallic compound can be stably supplied can be extended.

Comparative Example 1

Figure 30:
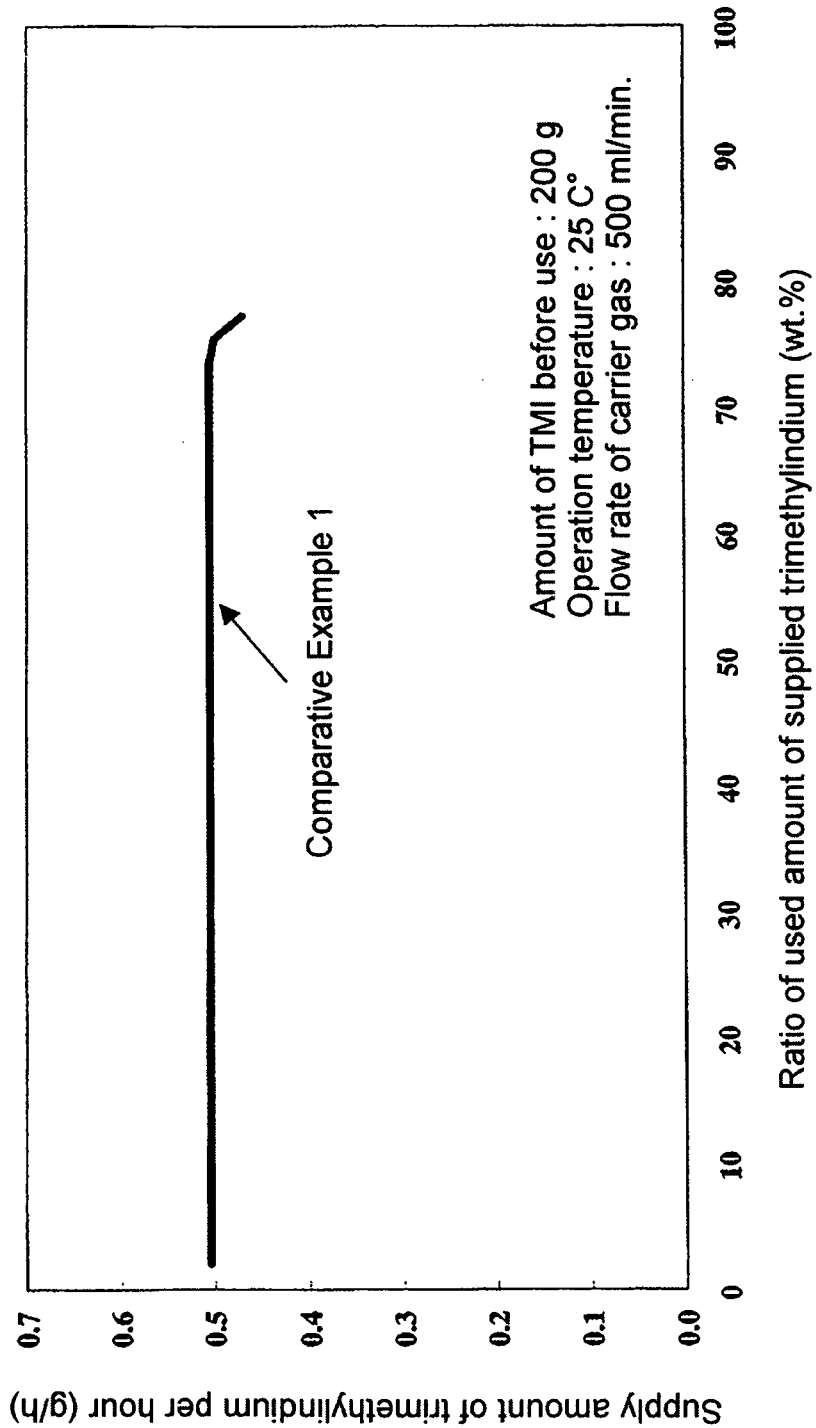
FIG. 30 is a graph showing the supply stability test results for trimethylindium in Comparative Example 1 (the relationship between the ratio of the used amount of the supplied trimethylindium and the supply amount of trimethylindium per hour)

In Comparative Example 1, the supply stability of the solid organometallic compound was tested by following the same procedure as in Example 1, except that trimethylindium was pulverized under nitrogen atmosphere and sieved through a sieve having a mesh size of 2.36 mm. Therefore, in this case, the grain size of trimethylindium was 2.36 mm or less. The results are shown in FIG. 30. The vertical axis of the graph shown in FIG. 30 represents the supply amount of trimethylindium per hour, and the horizontal axis represents the ratio of the used amount of the supplied trimethylindium in percent by weight. As can been seen from the supply stability test results, when the grains of trimethylindium did not comprise the grains having a grain size of 2.5 to 6 mm, the supply rate of trimethylindium was stable up to a ratio of the used amount of 77 wt. %.

As above, when the grains of trimethylindium do not comprise grains having a grain size of 2.5 to 6 mm and were packed, the long-term supply rate stability achieved in Example 1 was not obtained.

Example 2

Figure 31:
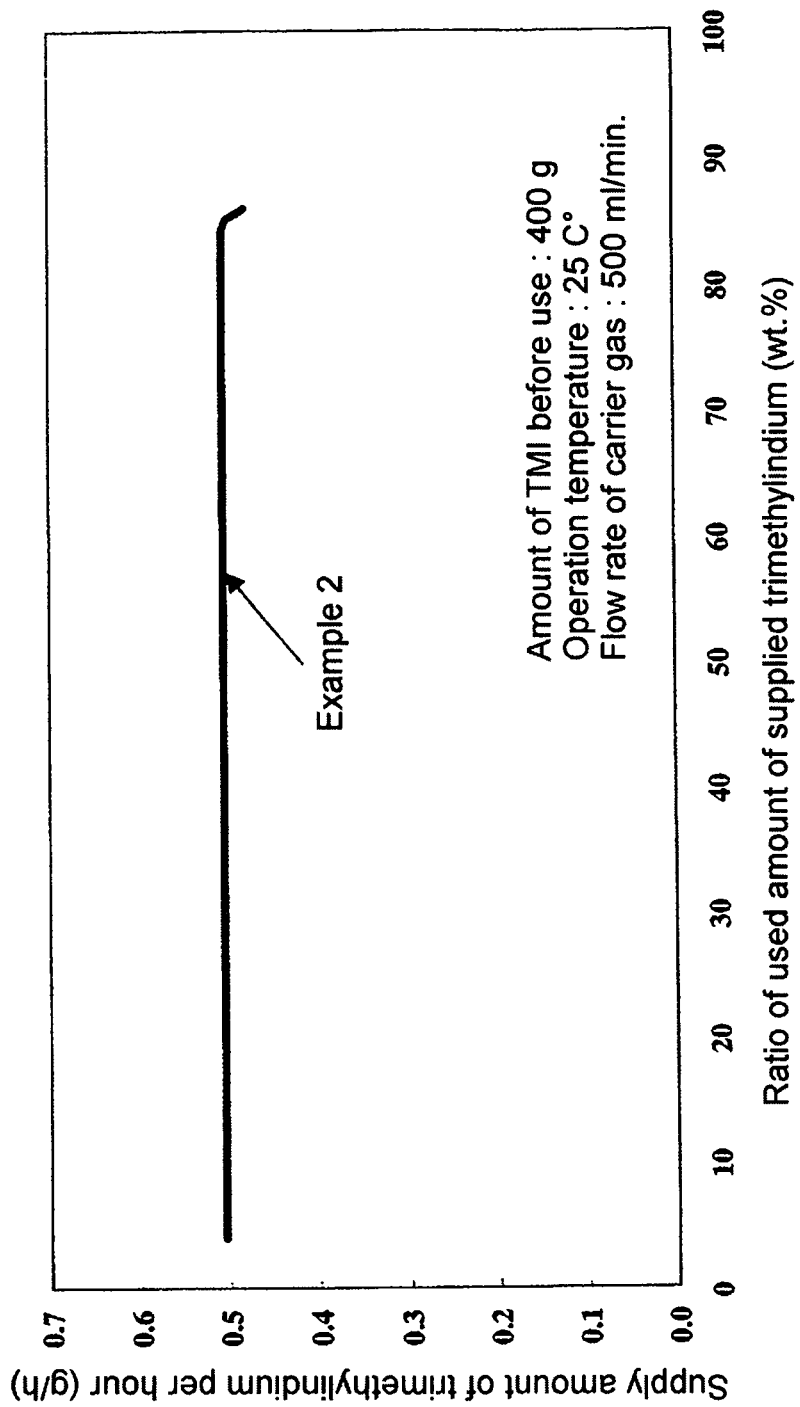
FIG. 31 is a graph showing the supply stability test results for trimethylindium in Example 2 (the relationship between the ratio of the used amount of the supplied trimethylindium and the supply amount of trimethylindium per hour)

In Example 2, the supply stability of the solid organometallic compound was tested by following the same procedure as in Example 1, except that a container for packing made of SUS and having an outer diameter of 76 mmφ shown in FIG. 28, 400 g of grain size-controlled trimethylindium, 394 g of a stainless steel packing material having dimensions of 0.9 mm×1.8 mm×1.8 mm, and 78 g of a stainless steel packing material having dimensions of 2.5 mm×5.0 mm×5.0 mm were employed. The results are shown in FIG. 31. The vertical axis of the graph shown in FIG. 31 represents the supply amount of trimethylindium per hour, and the horizontal axis represents the ratio of the used amount of the supplied trimethylindium in percent by weight. As can been seen from the supply stability test results, when the grains of trimethylindium comprised the grains having a grain size of 2.5 to 6 mm, the supply rate of trimethylindium was stable up to a ratio of the used amount of 85 wt. %.

Example 3

Figure 34:
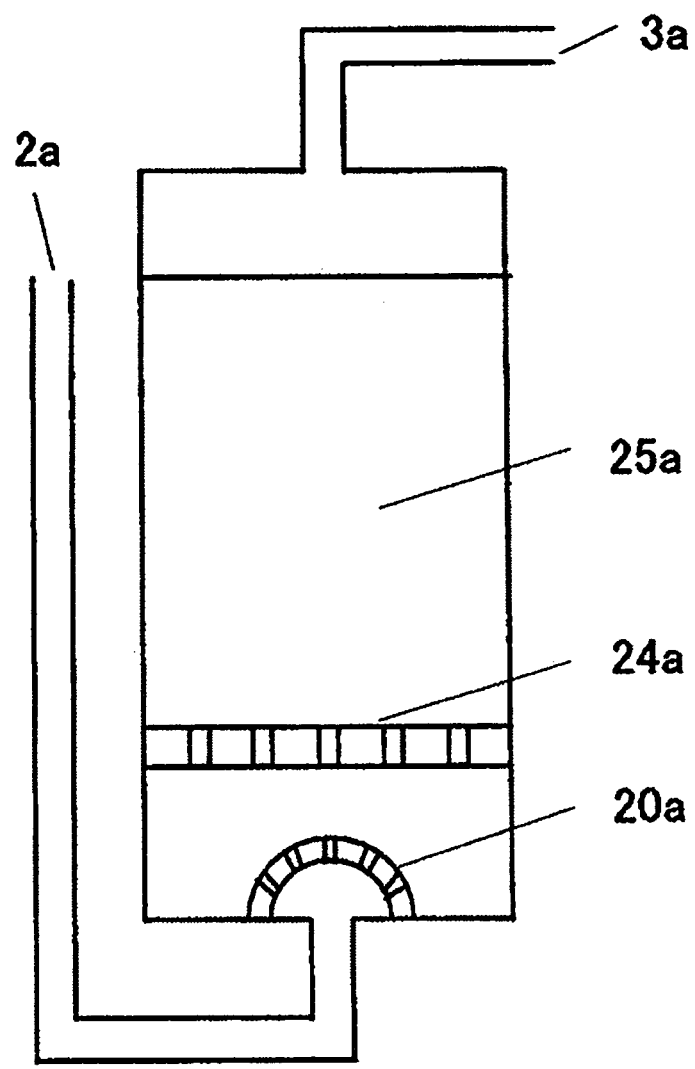
FIG. 34 is a schematic cross-sectional view showing a conventional packing container B.
Figure 35:
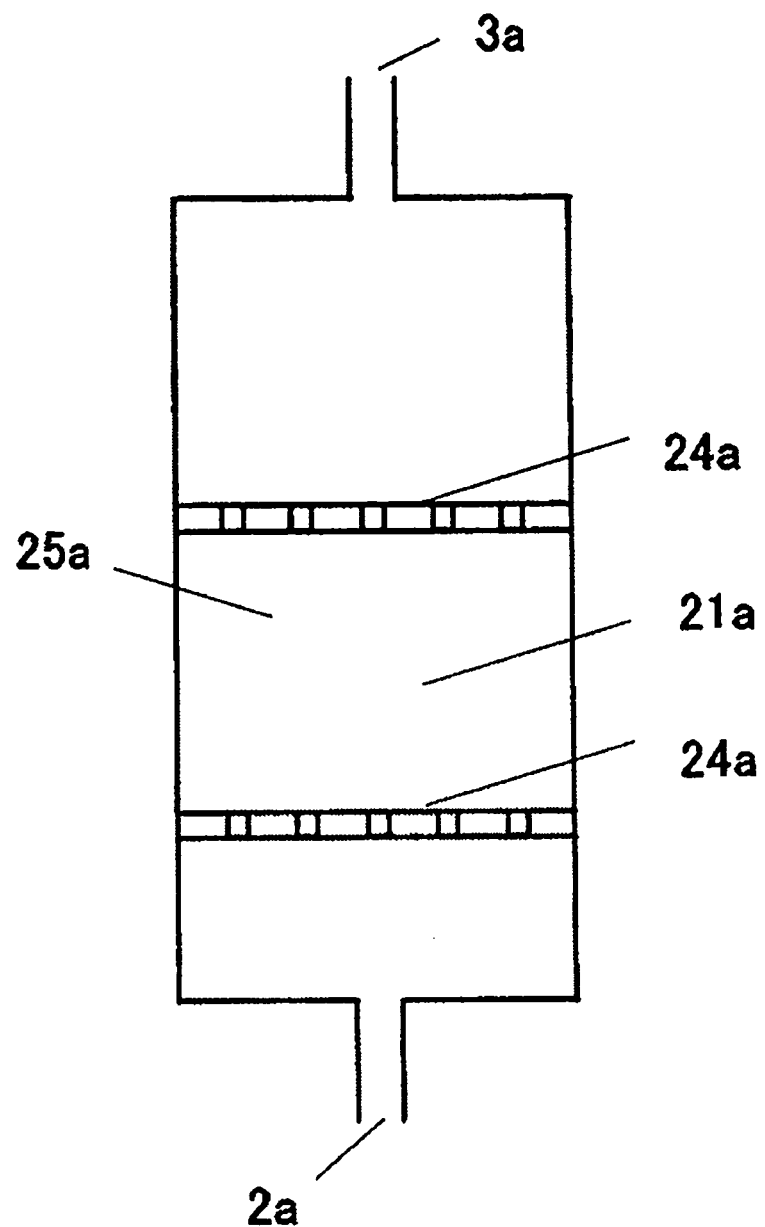
FIG. 35 is a schematic cross-sectional view showing a conventional packing container C.
Figure 36:
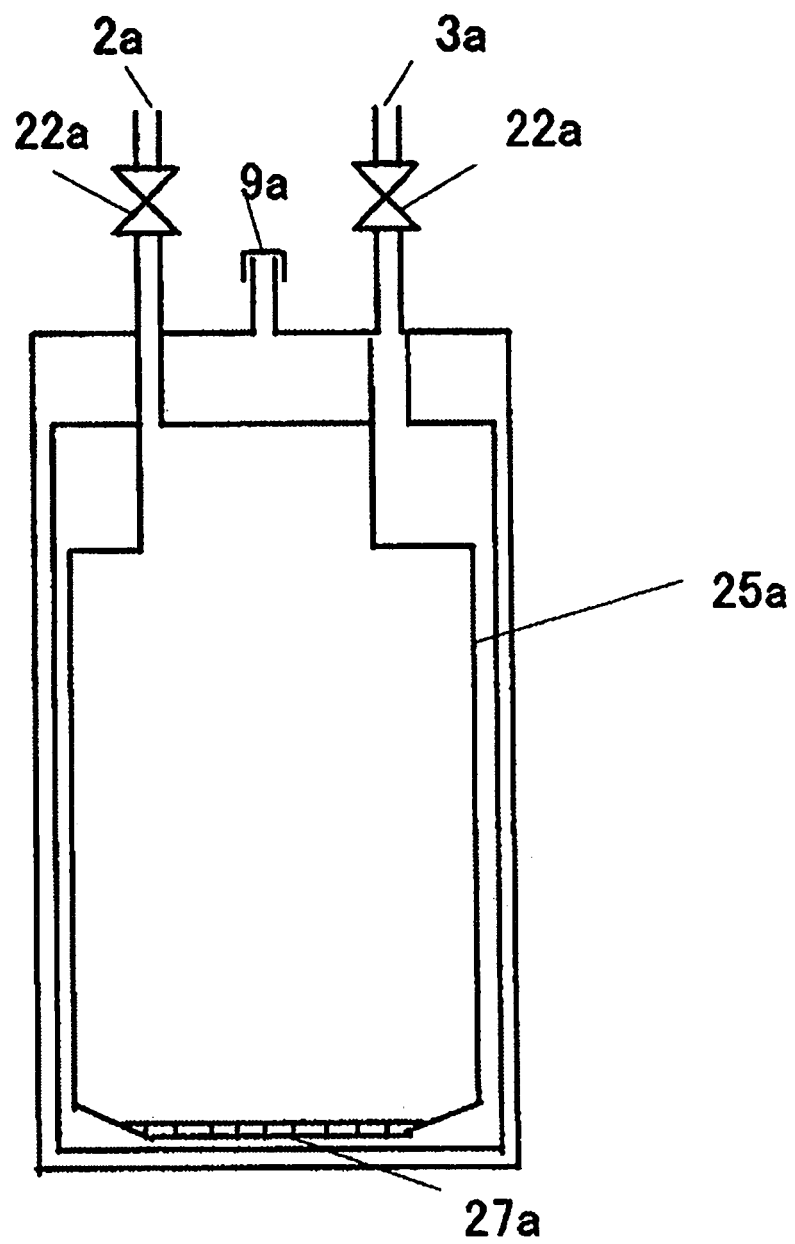
FIG. 36 is a schematic cross-sectional view showing a conventional packing container D.

In Example 3, the supply stability of the solid organometallic compound was tested by following the same procedure as in Example 1, except that a different container for packing and 100 g of grain size-controlled trimethylindium were employed. In this case, the employed container was made of glass and had an outer diameter of 35 mmφ and a structure in which a diffuser (20a) was removed from a container having the structure shown in FIG. 34. As can been seen from the supply stability test results, when the grains of trimethylindium comprised the grains having a grain size of 2.8 to 4.75 mm, the supply rate of trimethylindium was stable up to a ratio of the used amount of 76 wt. %.

Comparative Example 2

Figure 32:
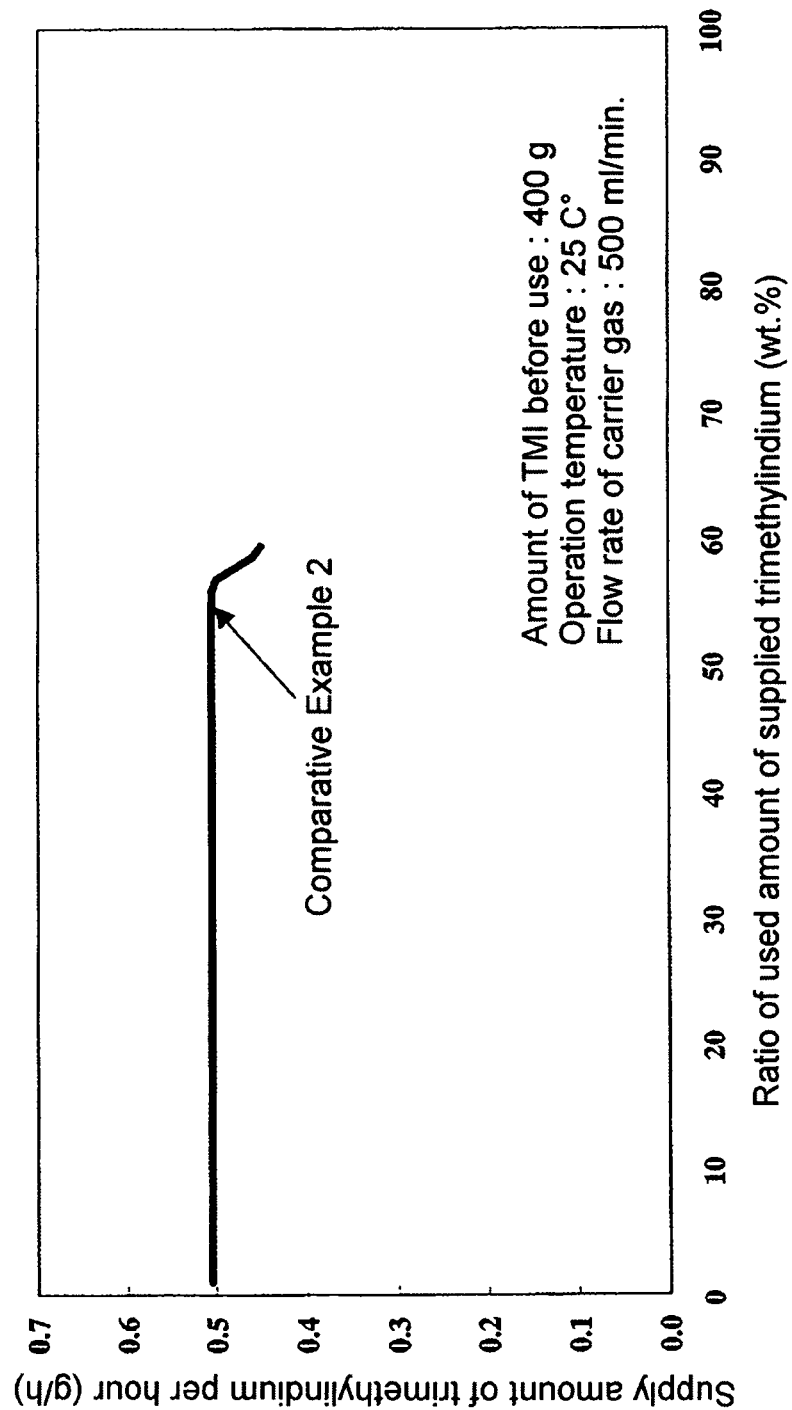
FIG. 32 is a graph showing the supply stability test results for trimethylindium in Comparative Example 2 (the relationship between the ratio of the used amount of the supplied trimethylindium and the supply amount of trimethylindium per hour)
Figure 33:
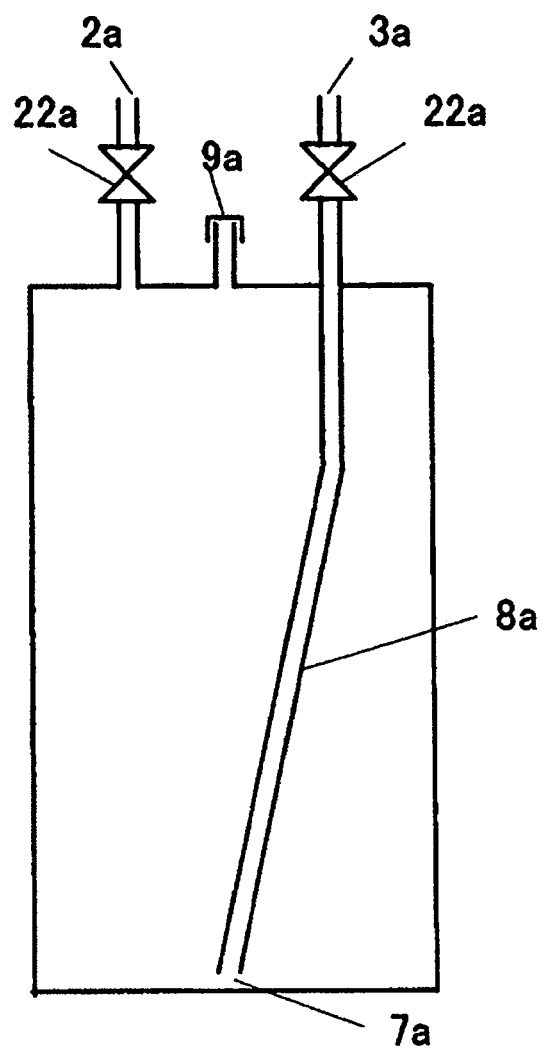
FIG. 33 is a schematic cross-sectional view showing a conventional packing container A.

In Comparative Example 2, the supply stability of the solid organometallic compound was tested by following the same procedure as in Example 1, except that trimethylindium was pulverized under nitrogen atmosphere and sieved through a sieve having a mesh size of 2.36 mm. Therefore, in this case, the grain size of trimethylindium was 2.36 mm or less. The results are shown in FIG. 32. The vertical axis of the graph shown in FIG. 32 represents the supply amount of trimethylindium per hour, and the horizontal axis represents the ratio of the used amount of the supplied trimethylindium in percent by weight. As can been seen from the supply stability test results, when the grains of trimethylindium did not comprise the grains having a grain size of 2.5 to 6 mm, the supply rate of trimethylindium was stable up to a ratio of the used amount of 59 wt. %.

As above, when trimethylindium grains of which did not comprise the grains having a grain size of 2.5 to 6 mm was packed and employed, the long-term supply rate stability achieved in Example 2 was not obtained.

Comparative Example 3

In Comparative Example 3, the supply stability of the solid organometallic compound was tested by following the same procedure as in Example 3, except that trimethylindium was pulverized under nitrogen atmosphere to prepare trimethylindium grains having a grain size of 0.1 to 0.3 mm. As found from the supply stability test results, when the grains of trimethylindium had a grain size of 0.1 to 0.3 mm, the supply rate of trimethylindium was stable up to a ratio of the used amount of 20 wt. %.

As above, when trimethylindium having a grain size of 0.1 to 0.3 mm was packed and employed, the long-term supply rate stability achieved in Example 3 was not obtained.

In the present invention, the grains of the solid organometallic compound essentially comprise grains having a certain grain size upon packing the compound into the container for packing the compound. Therefore, not only the initial supply stability can be ensured, but also the compound can be stably supplied to a vapor phase epitaxial growth apparatus such as an MOCVD apparatus for a long period of time.

What is claimed is:
1. A vapor phase epitaxial growth apparatus comprising a solid trimethylindium-packed container packed with solid trimethylindium,
wherein a grain size of the solid trimethylindium is 8 mm or less, and an amount of the solid trimethylindium having a grain size of 2.5 to 4.75 mm is 50 to 100% by weight of a total amount of the solid trimethylindium.
2. A vapor phase epitaxial growth apparatus comprising a solid trimethylindium-packed container, wherein a grain size of the solid trimethylindium is 8 mm or less, and an amount of the solid trimethylindium having a grain size of 2.5 to 4.75 mm is 50 to 100% by weight of a total amount of the solid trimethylindium, and wherein the container for packing the solid trimethylindium has a carrier gas inlet and a carrier gas outlet and has a structure in which the inside of the container is partitioned into a plurality of vertical spaces so that a carrier gas introduced from the carrier gas inlet flows through each of the vertical spaces and is discharged from the carrier gas outlet.

3. The vapor phase epitaxial growth apparatus of claim 2, wherein the container for packing a solid trimethylindium is configured such that:

(a) the inside of the container is partitioned by at least one partition in a vertical direction to form at least two partitioned spaces in the container;

(b) the spaces formed by partitioning the inside of the container by the partition include a space having the carrier gas inlet and a space having the carrier gas outlet; and (c) the partition inside the container includes a partition having an opening which allows the carrier gas to flow from the carrier gas inlet via each of the spaces inside the container to the carrier gas outlet.

4. The vapor phase epitaxial growth apparatus of claim 3, wherein when the opening is placed in a lower portion of the partition, the opening is placed in a position located at one-third or less of an internal height of the container measured from an internal bottom thereof, or when the opening is placed in an upper portion of the partition, the opening is placed in a position located at two-third or more of the internal height of the container measured from the internal bottom thereof.

5. The vapor phase epitaxial growth apparatus of claim 2, wherein the container is provided with a packing opening so as to pack the solid trimethylindium into the spaces formed inside the container by partitioning the container by the partition.

6. A vapor phase epitaxial growth apparatus comprising a solid trimethylindium-packed container in which a solid trimethylindium is packed together with a packing material, wherein a grain size of the solid trimethylindium is 8 mm or less, and an amount of the solid trimethylindium having a grain size of 2.5 to 4.75 mm is 50 to 100% by weight of a total amount of the solid trimethylindium.

7. The vapor phase epitaxial growth apparatus of claim 6, wherein the packing material has a size of 0.8 to 8 mm.

8. A vapor phase epitaxial growth apparatus comprising a solid trimethylindium-packed container, wherein a grain size of the solid trimethylindium is 8 mm or less, and an amount of the solid trimethylindium having a grain size of 2.5 to 4.75 mm is 50 to 100% by weight of a total amount of the solid trimethylindium, and the container for packing the solid trimethylindium has a carrier gas inlet and a carrier gas outlet and has a structure in which the inside of the container is partitioned into a plurality of vertical spaces so that a carrier gas introduced from the carrier gas inlet flows through each of the vertical spaces as a downward flow formed by means of carrier gas flow direction inverting means and is discharged from the carrier gas outlet.

9. The vapor phase epitaxial growth apparatus of claim 8, wherein the container for packing the solid trimethylindium is configured such that:

(d) the inside of the container is partitioned by at least one partition in a vertical direction to form at least two partitioned spaces in the container;

(e) the spaces formed by partitioning the inside of the container by the partition include a space having the carrier gas inlet and a space having the carrier gas outlet;

(f) the partition inside the container includes a partition having a communication flow passage which has a lower opening and an upper opening each for allowing a carrier gas to flow from the carrier gas inlet via each of the spaces inside the container to the carrier gas outlet;

(g) the communication flow passage is configured such that the carrier gas introduced inside the container is introduced from the lower opening of the communication flow passage and is discharged from the upper opening of the passage; and (h) the container has a discharging flow passage having a lower opening for discharging the carrier gas from a lower portion of the space having the carrier gas outlet to the carrier gas outlet.

10. The vapor phase epitaxial growth apparatus of claim 9, wherein the lower opening of the communication flow passage is placed in a position located at one-third or less of an internal height of the container measured from an internal bottom thereof;

the upper opening of the communication flow passage is placed in a position located at two-third or more of the internal height of the container measured from the internal bottom thereof; and the lower opening of the discharging flow passage is placed in a position located at one-third or less of the internal height of the container measured from the internal bottom thereof.

11. The vapor phase epitaxial growth apparatus of claim 8, wherein the container is provided with a packing opening so as to pack the solid trimethylindium into the spaces formed inside the container by partitioning the container by the partition.

12. The vapor phase epitaxial growth apparatus of claim 9, wherein the container is provided with a packing opening so as to pack the solid trimethylindium into the spaces formed inside the container by partitioning the container by the partition.

* * * * *